US012808957B2

(12) United States Patent
Schneider et al.

(10) Patent No.: US 12,808,957 B2
(45) Date of Patent: Nov. 24, 2026

(54) MACHINE LEARNING AND MAGNETIC FIELD SENSING TECHNIQUES FOR VEHICLE INSPECTION AND CONDITION ANALYSIS

(71) Applicant: ACV Auctions Inc., Buffalo, NY (US)

(72) Inventors: Philip Schneider, Amherst, NY (US); Livio Forte, III, Lloyd Harbor, NY (US); William Giegerich, Buffalo, NY (US); Justas Birgiolas, Milton, VT (US); Akhil Kanna Devarashetti, Amherst, NY (US)

(73) Assignee: ACV Auctions Inc., Buffalo, NY (US)

( * ) Notice: Subject to any disclaimer, the term of this patent is extended or adjusted under 35 U.S.C. 154(b) by 499 days.

(21) Appl. No.: 18/483,935

(22) Filed: Oct. 10, 2023

(65) Prior Publication Data

US 2025/0117845 A1 Apr. 10, 2025

(51) Int. Cl.
*G01R 33/12* (2006.01)
*G06N 3/0464* (2023.01)
*G06Q 30/08* (2012.01)

(52) U.S. Cl.
CPC ....... *G01R 33/1215* (2013.01); *G06N 3/0464* (2023.01); *G06Q 30/08* (2013.01)

(58) Field of Classification Search
CPC ... G01R 33/1215; G06N 3/0464; G06Q 30/08
See application file for complete search history.

(56) References Cited

U.S. PATENT DOCUMENTS

2018/0292471 A1* 10/2018 Chen .................... B60W 40/12
2023/0342937 A1 10/2023 Hever et al.

FOREIGN PATENT DOCUMENTS

WO WO-2020140049 A1 * 7/2020 ............ G06T 7/536

OTHER PUBLICATIONS

Burak Kolukisa, Veli Can Yildirim, Cem Ayyildiz, Vehbi Cagri Gungor, "A deep neural network approach with hyper-parameter optimization for vehicle type classification using 3-D magnetic sensor," Computer Standards & Interfaces, vol. 84 Published Mar. 2023, Available online Oct. 2022 (Year: 2022).*

(Continued)

*Primary Examiner* — Catherine T. Rastovski
*Assistant Examiner* — Nyla Gavia
(74) *Attorney, Agent, or Firm* — Wolf, Greenfield & Sacks, P.C.

(57) ABSTRACT

The inventors have developed technology to facilitate the inspection of vehicles, such as cars, to determine one or more characteristics of the vehicles. The characteristics of the vehicles may be determined based on magnetic field signals recorded from the vehicle, during the operation of the vehicle. The technology includes hardware, software, and trained machine learning models for performing analyses to determine vehicle characteristics. The vehicle characteristics may include a make, model, drivetrain, battery type, electronic component condition, and/or vehicle structural condition. The vehicle conditions may be used in the generation of a vehicle report for later analysis.

19 Claims, 14 Drawing Sheets

(56) References Cited

OTHER PUBLICATIONS

Burak Kolukisa, Veli Can Yildirim, Bahadir Elmas, Cem Ayyildiz, Vehbi Cagri Gungor, "Deep learning approaches for vehicle type classification with 3-D magnetic sensor," Computer Networks, vol. 217 Published Nov. 2022, Available online Aug. 2022 (Year: 2022).*

W. Li, Z. Liu, Y. Hui, L. Yang, R. Chen, X. Xiao, "Vehicle classification and speed estimation based on a single magnetic sensor," IEEE Access 8 (2020) 126814-126824, http://dx.doi.org/10.1109/ACCESS.2020.3008483. (Year: 2020).*

Carolus et al., Vehicle Undercarriage Imaging System. Co-pending U.S. Appl. No. 18/227,047, filed Jul. 27, 2023.

Schneider et al., Multi-Sensor Devices and Systems for Evaluating Vehicle Conditions. Co-pending U.S. Appl. No. 18/353,676, filed Jul. 17, 2023.

* cited by examiner

MACHINE LEARNING AND MAGNETIC FIELD SENSING TECHNIQUES FOR VEHICLE INSPECTION AND CONDITION ANALYSIS

BACKGROUND

Vehicles are often bought and sold multiple times throughout their lifetimes. Vehicle buying and selling transactions may occur in person or online in a virtual sales environment, and may also occur at auctions, either in person or online over the Internet. Because of the large volume of vehicles sold at auction, it is often not possible for buyers to inspect vehicles in person, let alone have the vehicles inspected by qualified mechanics. Buyers often rely on auction houses or third-party inspection services to provide vehicle data upon which purchasing decisions may be made. This vehicle data is often provided as a written report in electronic form. The value of a vehicle condition report is based, in large part, on the accuracy and completeness of the data it contains. Some of the most important parts of the vehicle report is information about the vehicle model, drivetrain, trim level, and battery, which are difficult to discern in hybrid and electric vehicles.

SUMMARY

Some embodiments provide for a method, comprising: using at least one computer hardware processor to perform: receiving magnetic field measurements of a vehicle, the magnetic field measurements collected by a magnetic field sensor positioned proximate the vehicle; and processing the magnetic field measurements using a trained ML model to detect, from the magnetic field measurements, a characteristic of the vehicle, the processing comprising: generating magnetic field features from the magnetic field measurements; and processing the magnetic field features using the trained ML model to obtain an output indicative of the characteristic of the vehicle.

Some embodiments provide a system comprising: at least one computer hardware processor; and at least one non-transitory computer-readable storage medium storing a vehicle inspection application comprising instructions which, when executed by the at least one computer hardware processor, cause the at least one computer hardware processor to perform: receiving magnetic field measurements of a vehicle, the magnetic field measurements collected by a magnetic field sensor positioned proximate the vehicle; and processing the magnetic field measurements using a trained ML model to detect, from the magnetic field measurements, a characteristic of the vehicle, the processing comprising: generating magnetic field features from the magnetic field measurements; and processing the magnetic field features using the trained ML model to obtain an output indicative of the characteristic of the vehicle.

Some embodiments provide at least one non-transitory computer-readable storage medium storing a vehicle inspection application comprising instructions which, when executed by at least one computer hardware processor, cause the at least one computer hardware processor to perform: receiving magnetic field measurements of a vehicle, the magnetic field measurements collected by a magnetic field sensor positioned proximate the vehicle; and processing the magnetic field measurements using a trained ML model to detect, from the magnetic field measurements, a characteristic of the vehicle, the processing comprising: generating magnetic field features from the magnetic field measurements; and processing the magnetic field features using the trained ML model to obtain an output indicative of the characteristic of the vehicle.

In some embodiments, the magnetic sensor is a part of a smartphone positioned proximate the vehicle. In some embodiments, the magnetic field measurements comprise a time series of measurements for each of multiple measurement axes. In some embodiments, the magnetic field measurements comprise a time series of x-axis measurements, a time series of y-axis measurements, and a time-series of z-axis measurements.

In some embodiments, the detected characteristic of the vehicle is a model of the vehicle. In some embodiments, the detected characteristic of the vehicle is a trim type of the vehicle. In some embodiments, the detected characteristic of the vehicle is a battery type in the vehicle. In some embodiments, the detected characteristic of the vehicle is a drivetrain type of the vehicle. In some embodiments, the vehicle is an electric vehicle. In some embodiments, the vehicle is a hybrid vehicle.

In some embodiments, the magnetic field measurements comprise a time series of measurements for each of multiple measurement axes, and generating magnetic field features from the magnetic field measurements comprises: resizing each of the time series of measurements, and normalizing each of the time series of measurements.

In some embodiments, the trained ML model comprises a 1-dimensional (1D) convolutional neural network (CNN) trained to detect, from magnetic field measurements of a vehicle, the characteristic of the vehicle. In some embodiments, the 1D CNN comprises between 100,000 and 1 million parameters. The parameters may be used to determine the characteristic of the vehicle.

In some embodiments, the method additionally comprises recording the magnetic field measurements using the magnetic field sensor; and transmitting the magnetic field measurements via at least one communication network to a computing device comprising at least one computer hardware processor where the processing of the magnetic field measurements is performed. In some embodiments, the method additionally comprises generating an electronic vehicle condition report including the characteristic of the vehicle. In some embodiments, the method additionally comprises transmitting the electronic vehicle condition report, via at least one communication network, to a remote device of an inspector of the vehicle. In some embodiments, the method additionally comprises transmitting the electronic vehicle condition report, via at least one communication network, to one or more reviewers. In some embodiments, the method additionally comprises initiating an online vehicle auction to auction the vehicle, upon review and approval of the electronic vehicle condition report.

BRIEF DESCRIPTION OF THE DRAWINGS

Various aspects and embodiments are described with reference to the following figures. The figures are not necessarily drawn to scale. Items appearing in multiple figures are indicated by the same or similar reference number in all the figures in which they appear. In the figures.

DETAILED DESCRIPTION

Figure 1:
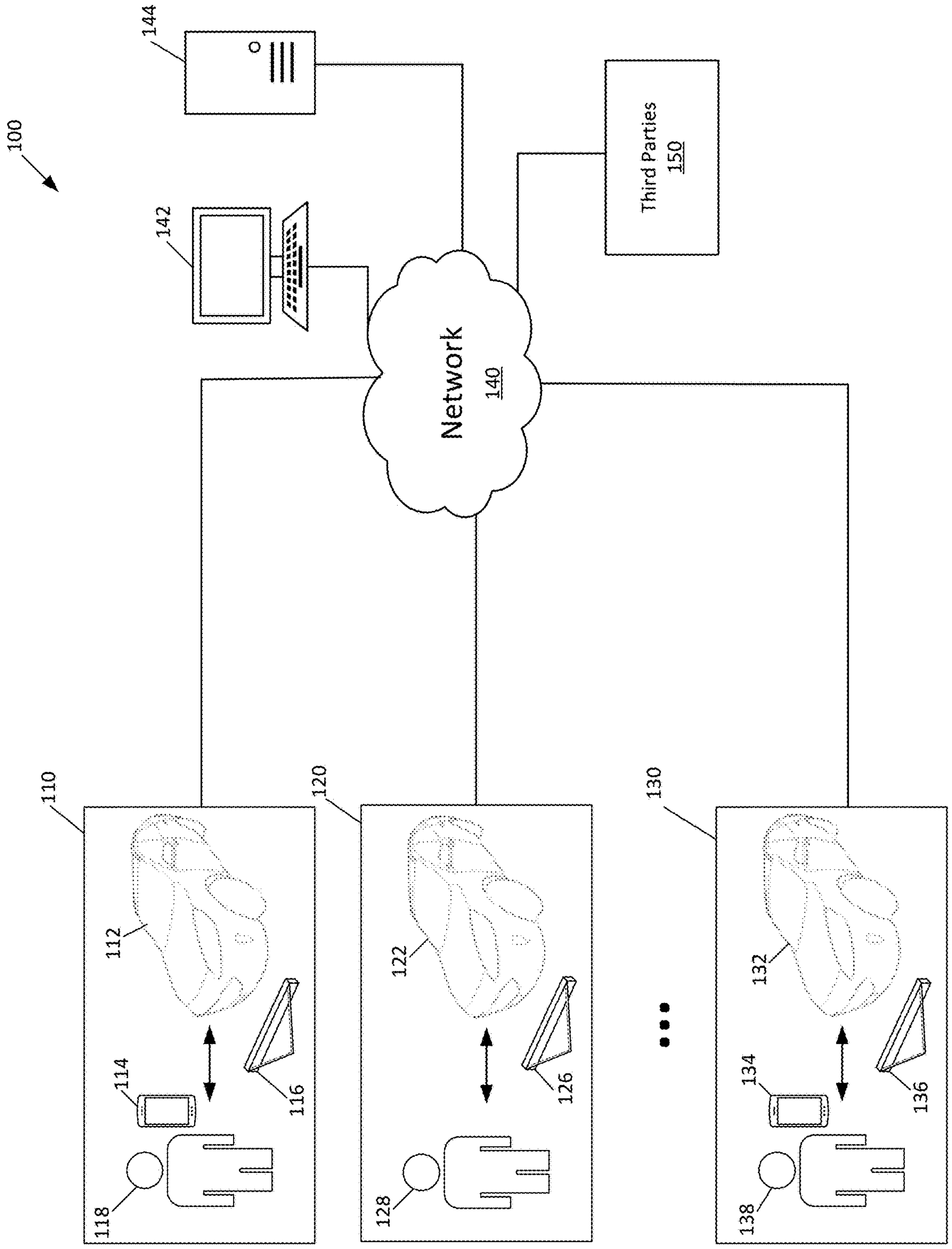
FIG. 1 illustrates an example of vehicle inspection system 100, in accordance with some embodiments of the technology described herein.

As described above, it is important to provide accurate and complete vehicle data to prospective vehicle buyers. It is especially important to provide accurate information on the model, drivetrain, trim level, and battery of a vehicle. One aspect of providing information on the model, drivetrain, trim level, and battery of a vehicle is properly identifying these characteristics of the vehicle during inspection and providing this information to prospective buyers for review.

One challenge in obtaining sufficient information about the vehicle model, drivetrain, trim level, and battery, is the lack of easily discernible identifiers (e.g., numbers, badges, markings, etc.) for these characteristics provided on vehicles, especially on hybrid and electric vehicles. However, these identifiers are not standard across vehicle manufacturers and may not specify all vehicle information of interest such as the vehicle model, drivetrain, trim level, and battery type of the vehicle, requiring additional analysis by a vehicle inspector to obtain all vehicle information. In addition, modern trends in vehicle design involve minimal branding and badging of vehicles, increasing the difficulty of identifying vehicle information. Further, vehicle owners may manually remove badges from their vehicles or add badges to their vehicles corresponding to a different vehicle model, drivetrain, trim level, or battery. Without easily discernible identifiers, vehicle inspectors must spend additional time inspecting and analyzing vehicles to accurately identify the model, drivetrain, trim level, and/or battery type for a vehicle. In some circumstances, because of the lack of standardization between vehicles in displaying characteristics such as the model, drivetrain, trim level, and/or battery type, or because some vehicles do not display some of characteristics at all, an inspector may not easily be able to determine the vehicle model, drivetrain, trim level, or battery type of a vehicle. In such cases, the value of the data in the vehicle report is low because a buyer cannot make a properly informed decision. In addition, because of the volume of vehicles which are inspected by vehicle sellers, inefficiencies in the vehicle inspection process may result in significant delays and increased costs for sellers.

In some circumstances, information including the vehicle model, drivetrain, trim level, and battery type may be identified based on parts visible from the exterior of the vehicle, including parts of the vehicle body or parts visible in the vehicle undercarriage. However, many hybrid and electric vehicles do not vary in appearance according to the vehicle model, drivetrain, trim level, and battery type, because vehicle parts, including drivetrain parts such as batteries and motors, are not visible in the undercarriage or engine bay of the vehicle. The lack of visibility of vehicle parts including drivetrain parts such as batteries and motors, increases the difficulty of inspecting hybrid and electric vehicles compared to internal combustion vehicles, as similar parts of internal combustion engine vehicles are visible in the engine bay or through the undercarriage of the vehicle.

In addition, there are some vehicle components conditions that cannot be easily assessed during a routine inspection. Examples of such vehicle components include electrical components such as alternators, electric motors, and AC compressors and structural components such as a vehicle frame. The condition of these components may be difficult to assess because the components are not visible, or easily visible to an inspector or inspection device, and/or because damage to or abnormalities in these components cannot be easily identified. Understanding the condition of vehicle components is important for prospective buyers to understand, and without this information, buyers cannot make an informed purchasing decision.

Conventional techniques for inspecting vehicles include the use of vehicle inspection technologies, which may be integrated into devices such as mobile devices or vehicle inspection and analysis devices. Vehicle inspection technologies include the use of signal capture and analysis technologies which provide information on the conditions and characteristics of vehicles. These technologies may be used to capture and analyze signals including, images, videos, audio signals, and on board diagnostic (OBD) signals, among other signals, associated with a vehicle. Vehicle inspection technologies may be integrated into vehicle inspection and analysis devices.

Image capture technologies may include devices and/or methods which capture images or videos of parts or portions of vehicles, such as the body and undercarriage for later analysis. Image analysis technologies may process the images or videos of the vehicle to determine the conditions and characteristics of the vehicle. These image analysis technologies may involve the use of trained ML models and computer vision technologies. These technologies may be useful in identifying vehicle conditions such as damage to the exterior of the vehicle, the presence of rust on the vehicle or modifications made to the vehicle, and for identifying characteristics of the vehicle such as make and model of the vehicle. However, as discussed above, many vehicles do not have easily visually discernible identifiers for vehicle characteristics, therefore limiting the utility of these image analysis technologies. Additionally, these image capture and analysis technologies do not provide information on the conditions of vehicle components which are not visible from the exterior, interior, undercarriage, or engine bay of the vehicle.

Vehicle inspection technologies may also capture audio signals associated with vehicles, which may be analyzed, using different technologies such as trained ML models, to determine the conditions of vehicle components such as the engine and exhaust. However, some vehicle components such as electronic components and structural components do not produce sounds or do not produce easily discernible sounds, and therefore these audio recording and analysis techniques do not provide information on conditions of these components. OBD signals may be useful in analyzing the conditions of vehicle components and may provide information on specific components of the vehicle experiencing issues or having irregularities. However, OBD signals are limited because not all vehicle components have OBD signals generated in response to irregularities or issues, and OBD signals may not be generated for all issues or irregularities present within a vehicle.

The inventors have recognized that conventional techniques and technologies for identifying vehicle characteristics and conditions of vehicle components may be improved upon. In particular, the inventors have recognized that this improvement can be obtained by detecting magnetic field signals produced by vehicles and analyzing the detected magnetic field signals, for example, using machine learning technology. Electrical components of vehicles produce magnetic fields during use. Examples of such electrical components include, but are not limited to, vehicle batteries, powertrains, motors, alternators, compressors, and wiring. Such components, when in use, produce magnetic fields from the electrical current flowing through the components. Ferrous components of vehicles may also produce magnetic fields. The inventors recognized that such magnetic fields may be measured using a magnetic sensor and analyzed (e.g., by using one or more trained machine learning models) to determine information about the vehicle which produced the magnetic fields and/or its components. Accordingly, the inventors have developed machine learning technology for analyzing magnetic field signals produced by vehicles, which enable identifying vehicle characteristics and/or condition of vehicle components, which are otherwise difficult to ascertain using conventional techniques for identifying vehicle characteristics and the condition of vehicle components.

In particular, the inventors have recognized that measurements of the magnetic fields produced by a vehicle (e.g., an electric, hybrid, or internal combustion engine vehicle) as the vehicle is moving relative to a magnetic sensor or sensors may be analyzed to identify one or more characteristics of the vehicle, including the vehicle model, drivetrain, trim level, and/or battery type. In some embodiments, the magnetic fields may be measured by one or more magnetic sensors placed proximate the vehicle (e.g., on the ground underneath the vehicle). The magnetic sensors may be stand-alone or part of another device or devices (e.g., a smartphone). The magnetic sensor(s) may record magnetic fields as the vehicle passes over the magnetic sensor(s). The signals recorded by the magnetic sensor(s) may be analyzed to identify characteristics of the vehicle. In some examples, the magnetic sensor(s) may be moved relative to a stationary vehicle to record the magnetic fields. These techniques improve upon conventional vehicle inspection techniques by quickly and efficiently providing information on vehicle characteristics without requiring the inspector to search the vehicle for information on the vehicle characteristics, such as in the situations described above, where vehicle characteristics may not be readily identified. In addition, analyzing measurements of electric field signals provides improvements over conventional vehicle inspection technologies, as vehicle characteristics which could not previously be identified can be identified based on magnetic field measurement analysis.

The inventors have also recognized that measurements of the magnetic fields produced by a vehicle may be analyzed to identify abnormalities in one or more parts of the vehicle. Examples of vehicle parts include vehicle batteries, powertrains, motors, alternators, compressors, and structural components such as the vehicle frame, body parts or suspension components. Examples of abnormalities present within the vehicle include a malfunction with a vehicle part, presence of rust (e.g., surface, or structural), presence of damage (e.g., structural damage), holes, and/or other types of defects. The signals recorded by the magnetic sensor(s) may be analyzed to identify the presence of such abnormalities. The machine learning techniques developed by the inventors therefore improve upon conventional techniques and technologies for identifying abnormalities in vehicle parts, as conventional techniques and technologies are not capable of easily providing information on the conditions of the aforementioned vehicle parts. In turn, this improves the accuracy of a vehicle inspection report and better informs a prospective buyer of the vehicle condition.

Accordingly, the inventors have developed new techniques for analyzing the condition of vehicles and their components by recording and analyzing magnetic fields produced by the vehicle. In some embodiments, the techniques involve recording the magnetic fields produced by a vehicle as it passes near a magnetic sensor (e.g., positioned underneath, above, on the side, or otherwise proximate the vehicle within a distance at which the magnetic sensor can detect magnetic fields generated by the vehicle), and analyzing the recorded magnetic field measurements using a trained machine learning model (e.g., using a trained neural network) to determine one or more characteristics of the vehicle. The magnetic sensor(s) may be integrated into a mobile device (e.g., a cell phone, smartphone, tablet, and/or camera), or may be integrated into a vehicle inspection and analysis device. Examples of vehicle inspection and analysis devices are discussed in U.S. Pat. No. 11,783,851, titled "Multi-Sensor Devices and Systems for Evaluating Vehicle Conditions", filed on Dec. 22, 2022, the entirety of which is incorporated by reference herein. The magnetic sensor(s) may be used in conjunction with one or more other sensors during the inspection of vehicles, including, but not limited to cameras and microphones.

The inventors have recognized the accuracy of inspections (e.g., the likelihood that a vehicle inspection will detect all the vehicle defects which are present in a vehicle and the identified characteristics are correctly identified) and efficiency (e.g., the time and effort required to perform the inspection, compared to the information gathered during the inspection) may be improved by recording and/or analyzing magnetic fields produced by the vehicle during operation, compared to vehicle inspections conducted using conventional techniques and technologies. Some vehicle conditions and characteristics may be difficult to detect without the use of magnetic sensors and/or specially trained ML models which may detect the vehicle characteristics and conditions beyond the observational ability of a vehicle inspector or capabilities of conventional vehicle inspection technologies. For example, vehicle characteristics such as the vehicle model, vehicle drivetrain, and vehicle battery, among other characteristics, may not be identified based on the exterior of the vehicle or by vehicle inspection technologies and may require additional time and effort to determine. Additionally, some vehicle conditions, such as the condition of electrical, drivetrain and/or electrical components, may not be recognizable based on a standard vehicle inspection or by using conventional vehicle inspection technologies. Therefore, recording and/or analyzing magnetic field measurements associated with a vehicle, which may provide indications about difficult to detect vehicle characteristics and/or conditions, may improve the accuracy and efficiency of vehicle inspections.

Accordingly, some embodiments provide for a computer-implemented method comprising: (A) receiving magnetic field measurements of a vehicle (e.g., an electric vehicle, a hybrid vehicle, or an internal combustion engine vehicle), the magnetic field measurements collected by a magnetic field sensor positioned proximate the vehicle; and (B) processing the magnetic field measurements using a trained ML model (e.g., a trained deep neural network model) to detect, from the magnetic field measurements, a characteristic (e.g., model, trim, or battery type) of the vehicle, the processing comprising: (i) generating magnetic field features from the magnetic field measurements; and (ii) processing the magnetic field features using the trained ML model to obtain an output indicative of the characteristic of the vehicle.

In some embodiments, the method further comprises collecting the magnetic field measurements using the magnetic field sensor. The magnetic field sensor may be positioned proximate the vehicle and/or may be part of another device (e.g., a smartphone) positioned proximate the vehicle. The sensor (and/or device that the sensor is part of) may be positioned below the vehicle, above the vehicle, or on the side of the vehicle. Multiple sensors may be used and positioned at different positions relative to the vehicle. The sensor(s) may collect magnetic field measurements as the vehicle is operating, for example, as the vehicle is moving relative to the magnetic field sensor(s). As a specific example, the magnetic field sensor may be part of a device used to inspect the vehicle's undercarriage (e.g., it may be a magnetic sensor in a smartphone or other device having a camera for imaging the undercarriage of the vehicle).

In some embodiments, the magnetic field measurements comprise a respective time series of measurements for each of multiple measurement axes. For example, when the magnetic field sensor is capable of measuring the field along three axes, the magnetic field measurements may comprise a time series of x-axis measurements, a time series of y-axis measurements, and a time-series of z-axis measurements.

In some embodiments, the time series of measurements obtained by the magnetic field sensor(s) may be pre-processed prior to being provided as input to the trained ML model. For example, in some embodiments, generating magnetic field features from the magnetic field measurements comprises: (a) resizing each of the time series of measurements (e.g., to a standard length, for example, by upsampling, zero-padding, or downsampling), and normalizing each of the time series of measurements (e.g., by subtracting each signal's average value from each value in the time series).

In some embodiments, the trained ML model comprises a 1-dimensional (1D) convolutional neural network (CNN) trained to detect, from magnetic field measurements of a vehicle, the characteristic of the vehicle. In some embodiments, the 1D CNN comprises between 100,000 and 1 million parameters.

In some embodiments, the method may further comprise: recording the magnetic field measurements using the magnetic field sensor; and transmitting the magnetic field measurements via at least one communication network to a computing device comprising the at least one computer hardware processor.

In some embodiments the method further comprises generating an electronic vehicle condition report (in any suitable format) including the characteristic of the vehicle determined using the trained ML model. In some embodiments, the electronic vehicle condition report, via at least one communication network, may be transmitted to a remote device of an inspector of the vehicle. The inspector may review the determined characteristic for correctness and may, for example, confirm its correctness (e.g., via a GUI) or change its value. In some embodiments, the electronic vehicle condition report, via at least one communication network, to one or more reviewers. The reviewer(s) may review accuracy of the vehicle condition report to determine the likelihood of a claim dispute. Upon reviewing and approving the electronic vehicle condition report, an online vehicle auction to auction the vehicle may be initiated, manually or automatically, in some embodiments.

It should be appreciated that the techniques described herein may be implemented in any of numerous ways, as the techniques are not limited to any particular manner of implementation. Examples of details of implementation are provided herein solely for illustrative purposes. Furthermore, the techniques disclosed herein may be used individually or in any suitable combination, as aspects of the technology described herein are not limited to the use of any particular technique or combination of techniques.

FIG. 1 illustrates an example of vehicle inspection system 100, in accordance with some embodiments of the technology described herein. Vehicle inspection system 100 may be used to collect information about one or more vehicles and analyze the collected information to determine one or more characteristics of the vehicles. The information may be collected in connection with a vehicle inspection, such as vehicle inspection 110.

During a vehicle inspection, such as vehicle inspection 110, an inspector 118 (e.g., a trained vehicle inspector, a mechanic, a buyer, a seller, or any other party using vehicle inspection system 100) may use mobile device 114 to transmit information about vehicle 112 through network 140 to a remote computer 142 and/or server(s) 144 where the vehicle information may be stored and/or processed by trained machine learning models. After processing, vehicle information may be transmitted to one or more third parties 150 for analysis. The third party or parties 150 may include prospective buyers of vehicles.

In some embodiments, the vehicle information includes data gathered at least in part during inspection of the vehicle. For example, vehicle information may include magnetic sensor recordings acquired from the vehicle while the vehicle is in operation. As another example, the vehicle information may include a photo and/or video acquired during the vehicle inspection of the interior and/or exterior of the vehicle. The data may be obtained from one or more sensors within a device including magnetic sensors, cameras, and microphones. The data may be recorded using a vehicle inspection device, multiple vehicle inspection devices, a smartphone, multiple smartphones, a vehicle inspection device and a smartphone, multiple vehicle inspection devices and multiple smartphones or any other combination of devices.

Examples of magnetic sensors that may be used include Hall sensors, magnetometers, semiconducting magnetoresistors, ferromagnetic magnetoresistors, fluxgate sensors, resonant sensors, and induction magnetometers, among other sensors capable of detecting magnetic fields.

The vehicle information recorded in vehicle inspection 110 may be recorded by mobile device 114 or vehicle inspection assembly 116. A camera and/or magnetic sensor of mobile device 114 may be used to record signals from the vehicle 112 during operation. Vehicle inspection assembly 116, may have one or more sensors, including a camera and/or magnetic sensor integrated therein which may be used to record signals from vehicle 112 during operation. In some examples, vehicle inspection assembly 116 may be used in conjunction with mobile device 114. Vehicle inspection assembly 116, may assist in the capture of one or more signals relate to the vehicle 112, which may be used in the analysis of the vehicle. In some examples, vehicle inspection assembly 116 may support mobile device 114 to capture signals from the vehicle. In some examples, the vehicle inspection assembly 116 may record one or more signals and may transfer these signals to the mobile device 114. In some examples, a mobile device such as mobile device 114 may be used without a vehicle inspection assembly to record signals from the vehicle.

Recorded vehicle information from vehicle inspection 110 may be transmitted from mobile device 114 and/or vehicle inspection assembly 116 to one or more other devices via network 140. Recorded vehicle information may be transmitted to remote computer 142, where it may be analyzed using trained machine learning models, and/or reviewed by a reviewer. Recorded vehicle information may also be transmitted to server(s) 144, where it may be analyzed using trained machine learning models. In some examples, the remote computer and/or server(s) 144 may be configured to prepare a vehicle report based on the recorded vehicle information. In some examples the vehicle report may be transmitted to remote computer 142 for review by a reviewer. The vehicle report may be sent to one or more third parties 150. In some examples, the mobile device 114 performs the processing and analysis of the collected signals. In some examples the mobile device 114 generates the vehicle report, and/or transmits the vehicle report to one or more third parties 150. Any one of the mobile device 114, vehicle inspection assembly 116 or server(s) 144 may perform the analysis of the collected signals and/or may generate the vehicle report.

In the illustrated example of FIG. 1, vehicle inspection system 100 may include any suitable number of devices for collecting data about any suitable number of vehicles as aspects of the technology described herein are not limited by the number of devices that are part of the vehicle diagnostic system or the number of vehicles that such devices may be used to examine.

As shown in the example of FIG. 1, vehicle inspection system 100 includes mobile device 114 for conducting a vehicle inspection 110 on a vehicle 112 by an inspector 118, in conjunction with vehicle inspection assembly 116.

Second inspection 120 may be performed using a vehicle inspection assembly 126. Vehicle inspection assembly 126 may have components integrated therein for the recording, analysis, and transmittal of signals from vehicle 122.

Vehicle inspection system 100 may include an nth device 134 for conducting an nth vehicle examination 130 on an nth vehicle 132 by an nth inspector 138 in conjunction with vehicle inspection device 136, where n is any suitable integer greater than or equal to three. Although the illustrated vehicle inspection system 100 has at least three devices, in some cases, a vehicle diagnostic system may have one or two mobile devices, as aspects of the technology described herein are not limited in this respect.

Figure 2:
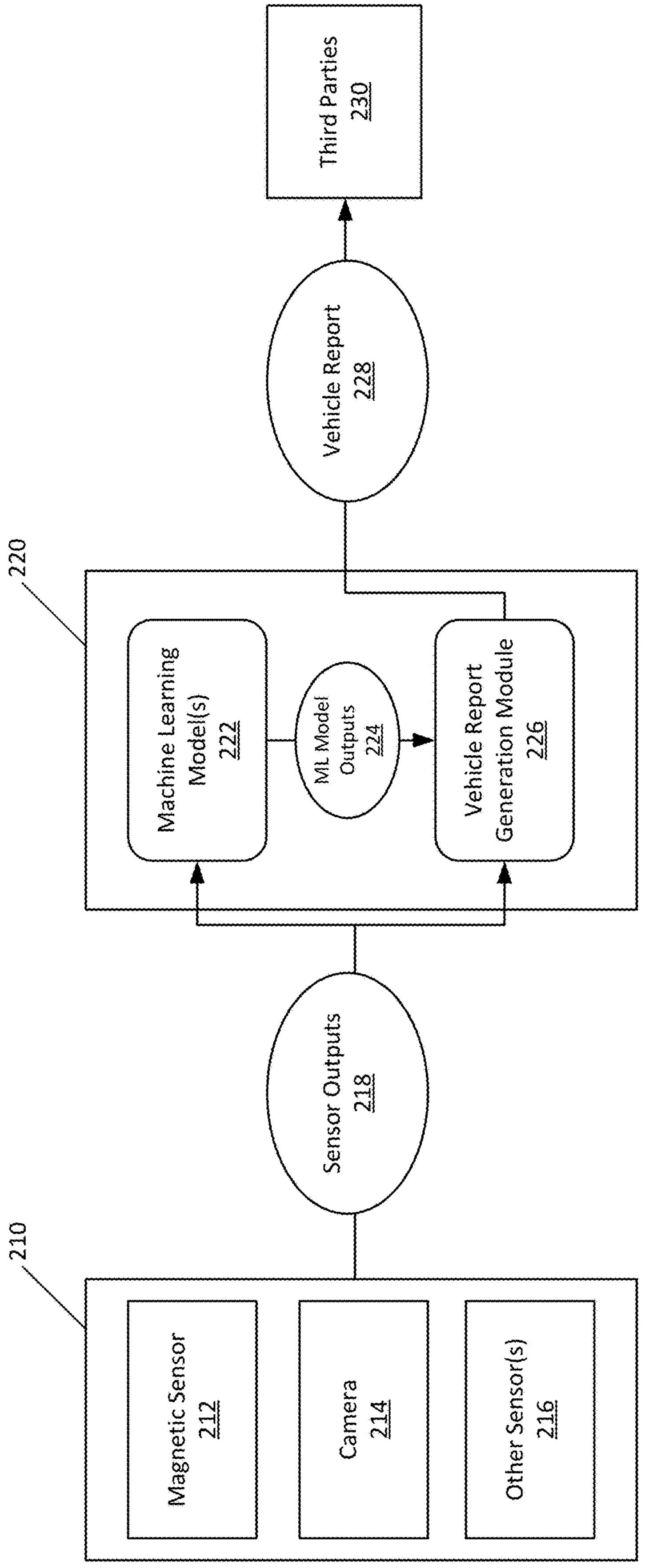
FIG. 2 is a diagram of a vehicle analysis process which may be performed by a vehicle inspection system, in accordance with some embodiments of the technology described herein.

FIG. 2 is a diagram of a vehicle analysis process which may be performed by a vehicle inspection system, in accordance with some embodiments of the technology described herein. The system may include vehicle inspection device 210. Vehicle inspection device may include a mobile device, a vehicle inspection assembly or both a mobile device and a vehicle inspection assembly, as described herein. As shown, vehicle inspection device 210 includes multiple sensors, including magnetic sensor 212, camera 214 and one or more other sensors 216. In some examples, vehicle inspection device 210 may include a greater or lesser number of sensor types. For example, the vehicle inspection device 210 may include one sensor, 2 sensors, 4, sensors, 5 sensors, 5-10 sensors, or greater than 10 sensors. In some examples, the vehicle inspection device 210 may include only a magnetic sensor. In some examples, the vehicle inspection device 210 may include a magnetic sensor and a camera, or a magnetic sensor and another sensor. The sensors may record signals of a vehicle, during the operation of the vehicle. The sensor outputs 218 recorded during the operation of the vehicle may be transmitted to analysis device 220 for analysis and inspection.

The sensors may each record a time series of data associated with the vehicle. The time series of data may be recorded as a vector storing the respective measurements or as a matrix storing a timestamp and measurement recorded at the timestamp, among other formats. There may be variations in the length of the time series of data recorded from the various sensors due to differences in sampling rate, recording start time, recording end time, and other factors. Variations may also exist in data collected from a single magnetic sensor, for example a 3-axis magnetometer may produce 3 time series of data associated with X, Y, and Z-axis measurements, and each of the 3 time series of data may vary in length. Therefore, preprocessing of signals may be performed to ensure each time series of data has the same number of samples for later analysis.

The length of the time series may be a predetermined length or may be based on the lengths of the recorded time series, for example an average of the lengths may be selected, the longest length may be used, or the shortest length may be used. The recorded time series of measurements may be adjusted to the desired length by cropping the signal to the desired length, either by removing data from the beginning or end of the time series. The recorded time series of measurements may also be adjusted to the desired length by zero padding the measurements, in which values of 0 are added to the beginning or end of the time series until it is at the desired length. Any suitable length of time series may be used as the desired length. For example, the desired length may be at least 100 samples, at least 300 samples, at least 500 samples, at least 600 samples, at least 700 samples, at least 800 samples, at least 1000 samples, at least 2000 samples or greater than 2000 samples.

Additional preprocessing may be performed on signals before they are transmitted to the analysis device 220. For example, signals may be normalized, such as through mean center normalization, in which the average value of the signal is subtracted from each value in the signal.

The signals may be transmitted to the analysis using any suitable method. For example, the signals may be transmitted via a common network, such as a cellular network, Wi-Fi, and/or Bluetooth. The signals may undergo specific processing before transmission to the analysis device 220 based on the transmission method used. For example, the signals may be compressed and packaged for transmission to the analysis device 220. The compression and/or packaging may be to a specific format associated with the particular transmission method.

Analysis device 220 may be an external computer or one or more servers, as described herein. In some examples, the vehicle inspection device 210 may perform the functions of analysis device 220. Analysis device 220 includes one or more machine learning models 222, which may analyze sensor outputs 218. Machine learning model(s) 222 may determine one or more characteristics of the vehicle, as described herein. Machine learning model(s) 222 may determine a condition of the vehicle base on the sensor outputs 218. The outputs 224 of the machine leaning model(s) 222 may be passed to a vehicle report generation module 226. Vehicle report generation module may prepare a vehicle report 228 based on the machine learning model outputs 224 and sensor outputs 218. The vehicle report 228 may include information related to vehicle characteristics and/or a condition of the vehicle. Vehicle report 228 may be passed to one or more third parties 230 for analysis.

Third parties 230 may include prospective buyers of vehicles who may analyze the vehicle report 228 to inform a vehicle purchasing decision. Third parties 230 may also include reviewers who may review the content of the vehicle report 228 and initiate an online vehicle auction to auction the vehicle upon approval of the vehicle report.

Figure 3A:
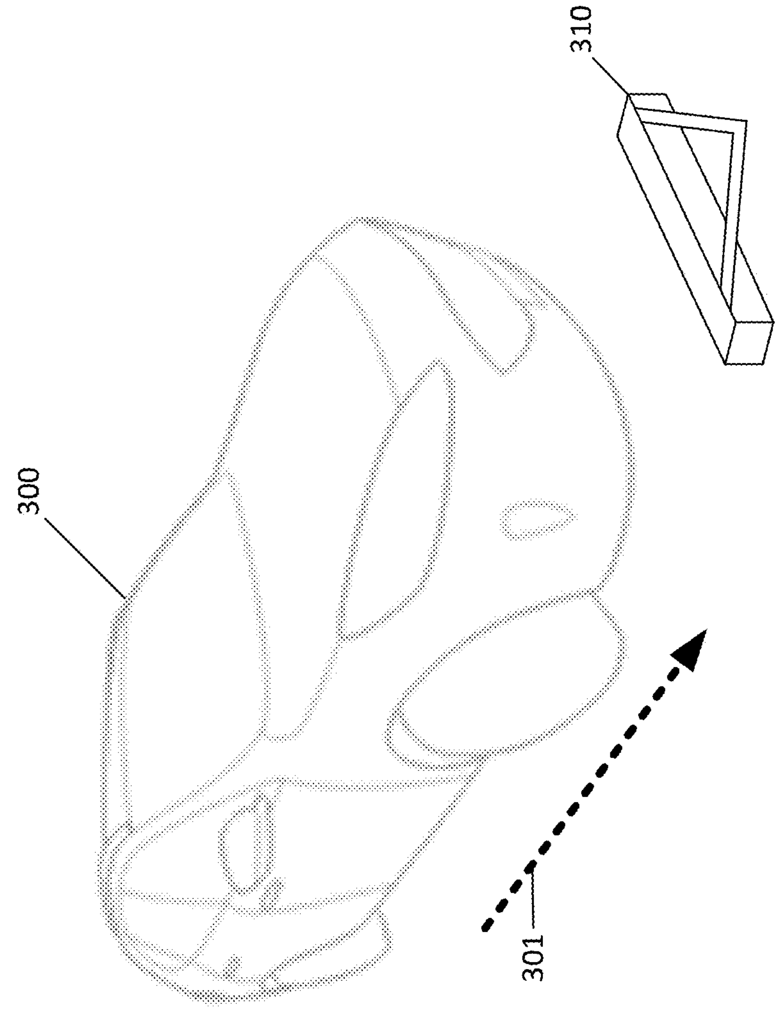
FIG. 3A illustrates an example of a vehicle inspection, in accordance with some embodiments of the technology described herein.

FIG. 3A illustrates an example of a vehicle inspection, in accordance with some embodiments of the technology described herein. The vehicle inspection may be performed on vehicle 300 to determine a condition and/or a characteristic of the vehicle 300.

Signals may be recorded from the vehicle 300 by vehicle inspection device 310. Vehicle inspection device 310 may include a mobile device and a vehicle inspection assembly supporting the mobile device to record signals from the vehicle 300. In some examples, the vehicle inspection device 310 may comprise a vehicle inspection assembly comprising one or more sensors configured to record signals from the vehicle 300.

Vehicle 300 may be driven in direction 301 over vehicle inspection device 310. Vehicle inspection device 310 may record signals from the vehicle 300 as it is driven. The vehicle inspection device 310 may record magnetic field signals using a magnetic sensor. Vehicle inspection device 310 may record additional signals including images or video using a camera, and audio using a microphone. The signals recorded by vehicle inspection device 310 may be transmitted to an external device for processing and analysis. The external device may be an external computer and/or one or more servers, as described herein. In some examples the vehicle inspection device 310 may perform processing and analysis of the signals.

Other techniques may be used to record signals from a vehicle. For example, a vehicle may be driven adjacent to one or more vehicle inspection devices which records signals from the vehicle as the vehicle passes. In some examples, the one or more vehicle inspection devices may be positioned at a side of the vehicle. In other examples, the one or more vehicle inspection devices may be positioned at two sides of the vehicle. In some examples the vehicle may remain stationary, and one or more vehicle inspection devices are moved around the vehicle to record signals from the vehicle. For example, a vehicle inspection device may be moved along a side of the vehicle, underneath the vehicle, around the exterior of the vehicle, or around a particular portion of the vehicle. In some examples, a user may be guided by the vehicle inspection device on how to record signals from the vehicle by moving the vehicle inspection device.

Figure 3B:
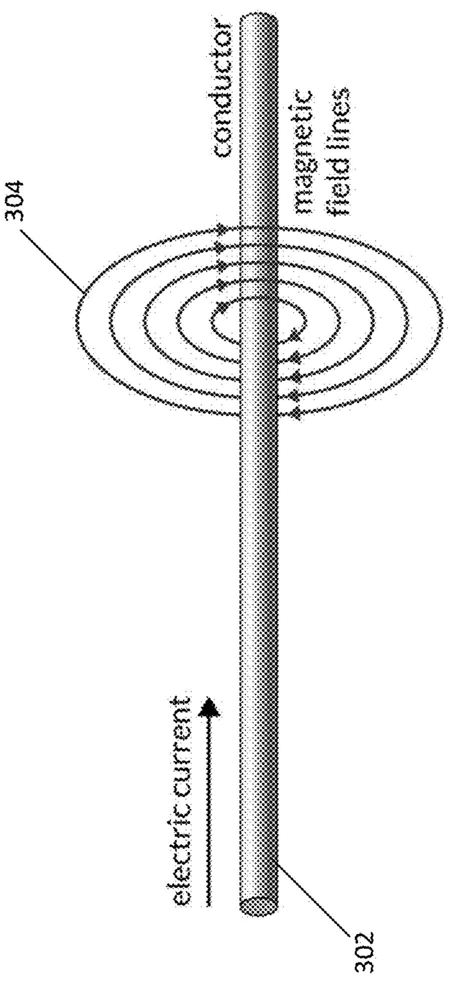
FIG. 3B is an example of an electrical component generating magnetic fields, in accordance with some embodiments of the technology described herein.

FIG. 3B is an example of an electrical component generating magnetic fields, in accordance with some embodiments of the technology described herein. As shown, conductor 302 has an electrical current flowing through. The electrical current will generate concentric magnetic fields 304 in a direction perpendicular to the flow of current. The magnetic fields 304 generated by conductor 302 may be sensed by a magnetic sensor, as described herein.

Some components of vehicles may generate magnetic fields similar to those shown in FIG. 3B. These components may include vehicle wiring, batteries, electric motors, and electric powertrain components. The magnetic fields generated by hybrid and electric vehicles are greater in magnitude than those produced in vehicles with combustion engines because the magnitude of magnetic fields is proportional to the current producing the fields, and electrical and hybrid vehicles require more current than internal combustion vehicles.

Figure 3C:
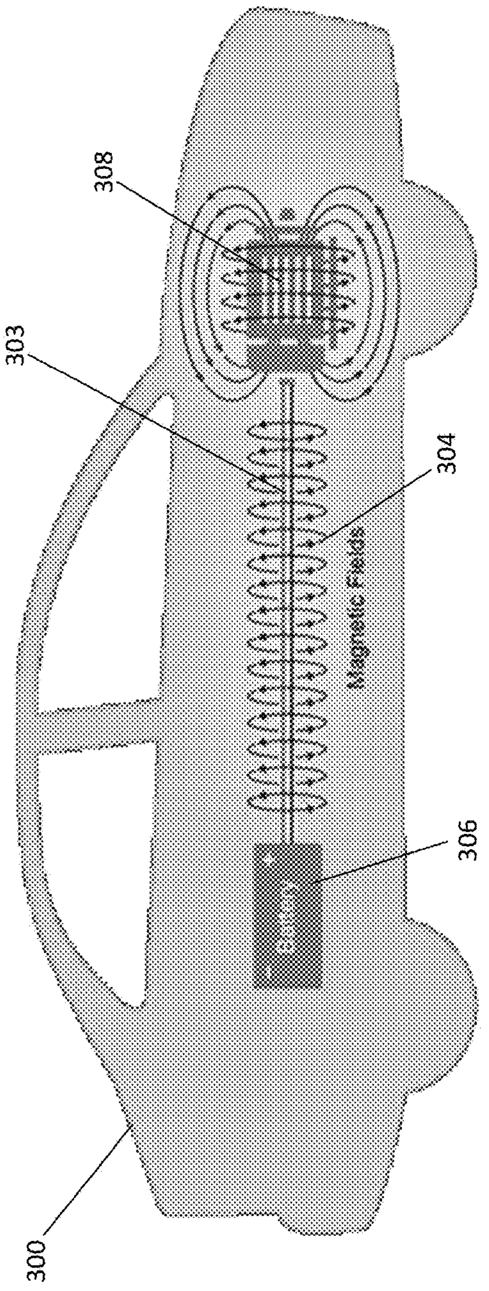
FIG. 3C is an example of an electric vehicle producing magnetic fields, in accordance with some embodiments of the technology described herein.

FIG. 3C is an example of an electric vehicle producing magnetic fields, in accordance with some embodiments of the technology described herein. Vehicle 300, may be an electric vehicle and includes battery 306, conductor 303 and electric motor 308. Battery 306 may provide power to the vehicle, which may be transformed into motion by the electric motor 308. The battery 306, conductor 303, and electric motor 308 may produce magnetic fields 304 during the operation of the vehicle, as shown. These magnetic fields may be measured via a magnetic sensor to determine one or more characteristics of the vehicle.

The magnetic fields 304 produced by vehicle components may vary in multiple dimensions, based on the arrangement and construction of vehicle components. For example, any turns or bends over the length of wiring will result in the magnetic fields produced to change direction over the length of the wiring. Vehicle components with many conductors which have varying dimensions and directions, such as motors with many wire coils, will produce magnetic fields which may vary across multiple dimensions. Therefore, using multiple magnetic sensors or a multi-dimensional magnetic sensor, for example a 2D or a 3D magnetic sensor will allow additional magnetic field information to be captured from vehicles.

The inventors have appreciated that due to the different designs of vehicles, different vehicles will produce unique magnetic fields during their operation. These unique magnetic fields may be measured and used to identify characteristics of vehicles including a vehicle model, drivetrain, trim level, and battery type.

Figure 3D:
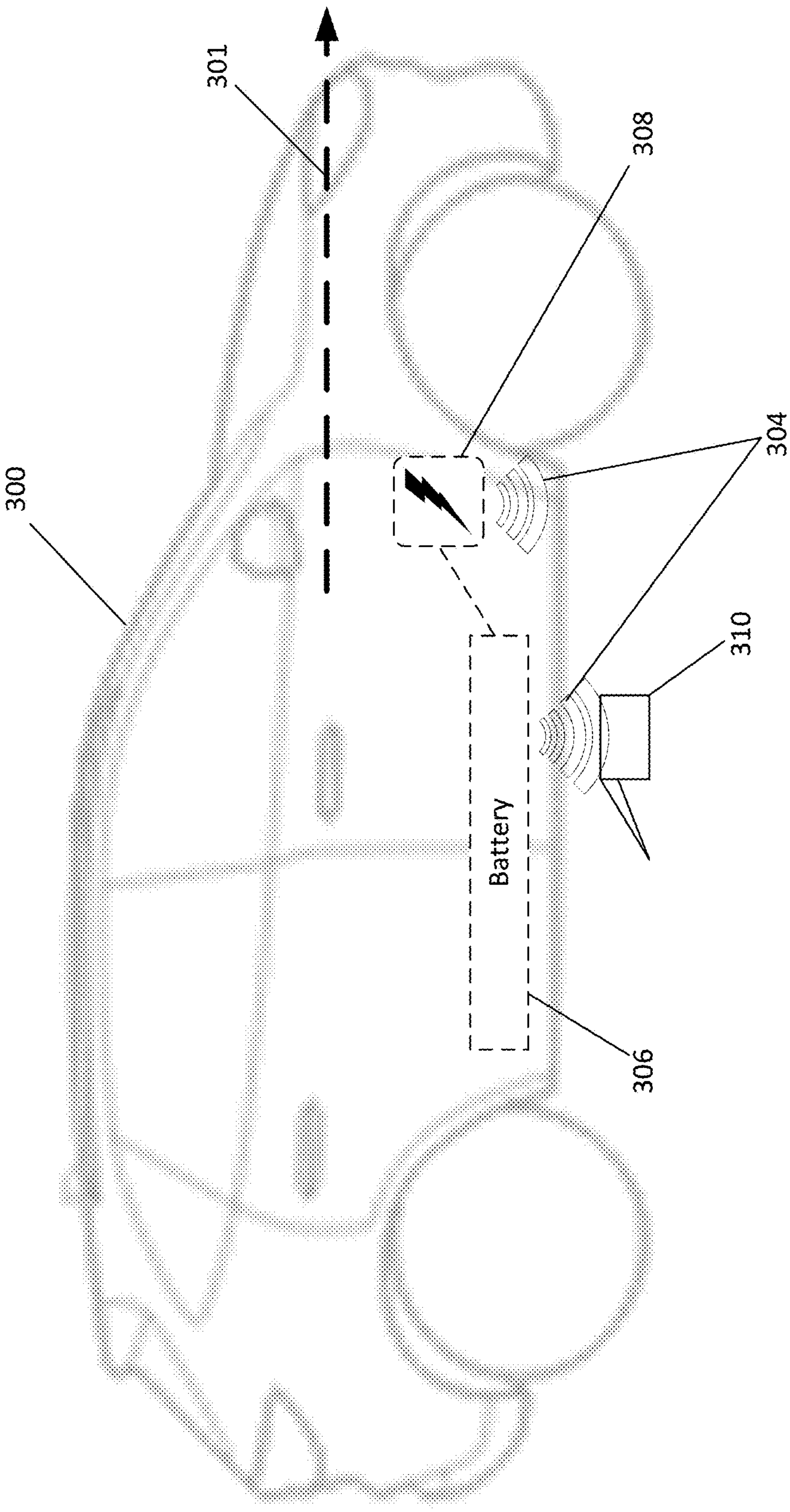
FIG. 3D illustrates an example environment in which magnetic fields of a vehicle are measured, in accordance with some embodiments of the technology described herein.

FIG. 3D illustrates an example environment in which magnetic fields of a vehicle are measured, in accordance with some embodiments of the technology described herein. The magnetic fields 304 generated by vehicle 300 are measured as the vehicle 300 travels in direction 301 over vehicle inspection device 310.

The battery 306 and electric motor 308 of vehicle 300 may generate magnetic fields during the operation of the vehicle. As the vehicle passes over the vehicle inspection device 310, the generated magnetic fields 304 may be measured by one or more magnetic sensors within the vehicle inspection device 310. As described herein, the one or more magnetic sensors may be integrated within the vehicle inspection device 310 or may be integrated within a mobile device supported within the vehicle inspection device 310. The one or more magnetic sensors may be single dimension magnetic sensors, which measure magnetic fields in one dimension, or may be multi-dimensional magnetic sensors which measure magnetic fields in two or three dimensions.

The magnetic sensors may be distributed in any suitable way within vehicle inspection device 310. For example, when vehicle inspection device contains a single magnetic sensor, the magnetic sensor may be located in the center of the vehicle inspection device 310. The magnetic sensor may also be located away from the center of the vehicle inspection device 310, for example at a side of the vehicle inspection device 310.

In examples with multiple magnetic sensors, the magnetic sensors may be located at the center of the vehicle inspection device 310 or may be distributed across the vehicle inspection device 310. For example, in a vehicle inspection device with three magnetic sensors, the magnetic sensors may be distributed symmetrically with a first magnetic sensor located at a first side of the vehicle inspection device 310, a second magnetic sensor located at the center of the vehicle inspection device 310, and a third magnetic sensor located at a third side of the vehicle inspection device 310. In some examples, the magnetic sensors may be distributed asymmetrically, for example in the case with three magnetic sensors two may be located on the first side of the vehicle inspection device 310, and the third may be located at the center or second side.

In some examples, the vehicle inspection device 310 may contain multiple magnetic sensors arranged in an array. The array of magnetic sensors may be arranged in one or more rows, each row containing multiple magnetic sensors. The rows may span all of, or a portion of the vehicle inspection device 310. Using multiple magnetic sensors or an array of magnetic sensors may allow for magnetic field signals from more portions of the vehicle to be recorded, than from the use of a single magnetic sensor. The additional data provided from the use of multiple magnetic sensors, or an array of magnetic sensors may improve the accuracy of vehicle characteristic identification.

The vehicle inspection device may record additional signals related to the vehicle, as the vehicle passes over. These additional signals may include audio recorded by a microphone and video or images of the vehicle. Examples of additional signals include images of the undercarriage of the vehicle, as described in U.S. Pat. No. 11,770,493, titled "Vehicle Undercarriage Imaging System", filed on Apr. 2, 2019, the contents of which are incorporated by reference herein in their entirety.

The images or videos recorded by a camera of the vehicle inspection device 310 may be used to generate a composite image of the undercarriage of the vehicle. The composite image may be used to determine a condition of the vehicle in addition to one or more characteristics of the vehicle. The images or videos may also be used for direct analysis of the vehicle, without generating a composite image of the vehicle.

Figure 3E:
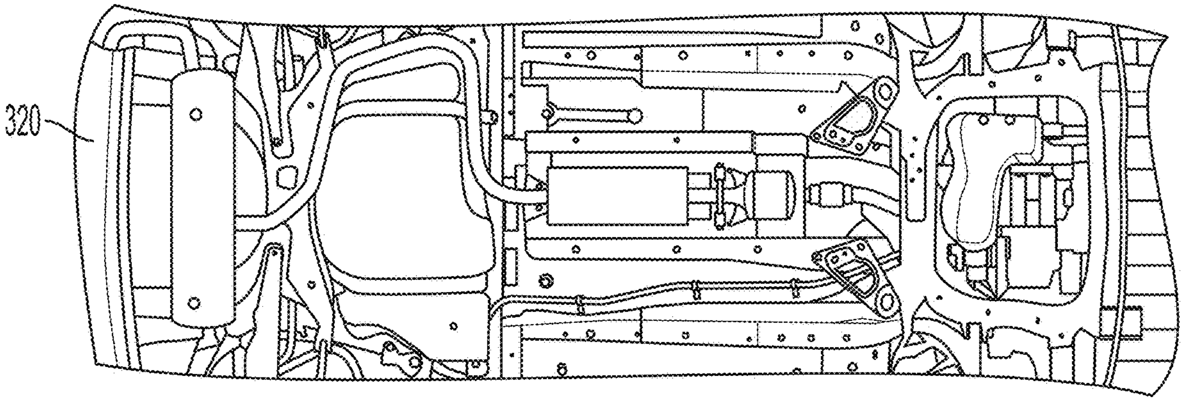
FIG. 3E is an example image of an undercarriage of a vehicle, which may be generated by using data collected by a vehicle inspection device, in accordance with some embodiments of the technology described herein.

FIG. 3E is an example image of an undercarriage of a vehicle, which may be generated by using data collected by a vehicle inspection device, in accordance with some embodiments of the technology described herein. The composite image 320 is of a vehicle with an internal combustion engine or a hybrid vehicle, and therefore there are many vehicle parts visible within the image. Visible in composite image 320 are parts of the vehicle including the engine, the exhaust, the catalytic converter, the transmission, the suspension, and the frame of the vehicle. These vehicle parts may be analyzed to determine a condition of the vehicle and one or more characteristics of the vehicle. This information may be incorporated into a vehicle report which may be used by a prospective buyer of the vehicle to inform a buying decision.

Figure 3F:
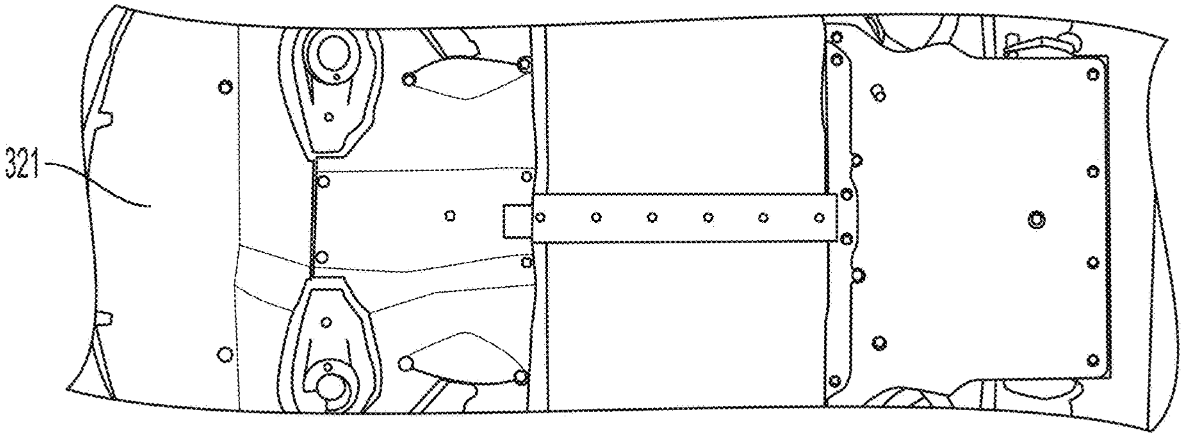
FIG. 3F is an example image of an undercarriage of an electric vehicle, which may be generated by using data collected by a vehicle inspection device, in accordance with some embodiments of the technology described herein.

FIG. 3F is an example image of an undercarriage of an electric vehicle, which may be generated by using data collected by a vehicle inspection device, in accordance with some embodiments of the technology described herein. The composite image 321 is of an electric vehicle and therefore there are very few vehicle parts which are visible in the image. Electric vehicles have fewer parts and require less maintenance than vehicles with internal combustion engines, and therefore do not have exposed parts at the undercarriage. In FIG. 3F, suspension parts and vehicle undercarriage covers are visible. The undercarriage images of electric vehicles do not contain sufficient information to determine a condition of the vehicle or to determine characteristics of the vehicle. Therefore, such images are of little value during the analysis of electric vehicles and demonstrate the need for additional techniques for analyzing and determining characteristics of electric vehicles.

Figure 3G:
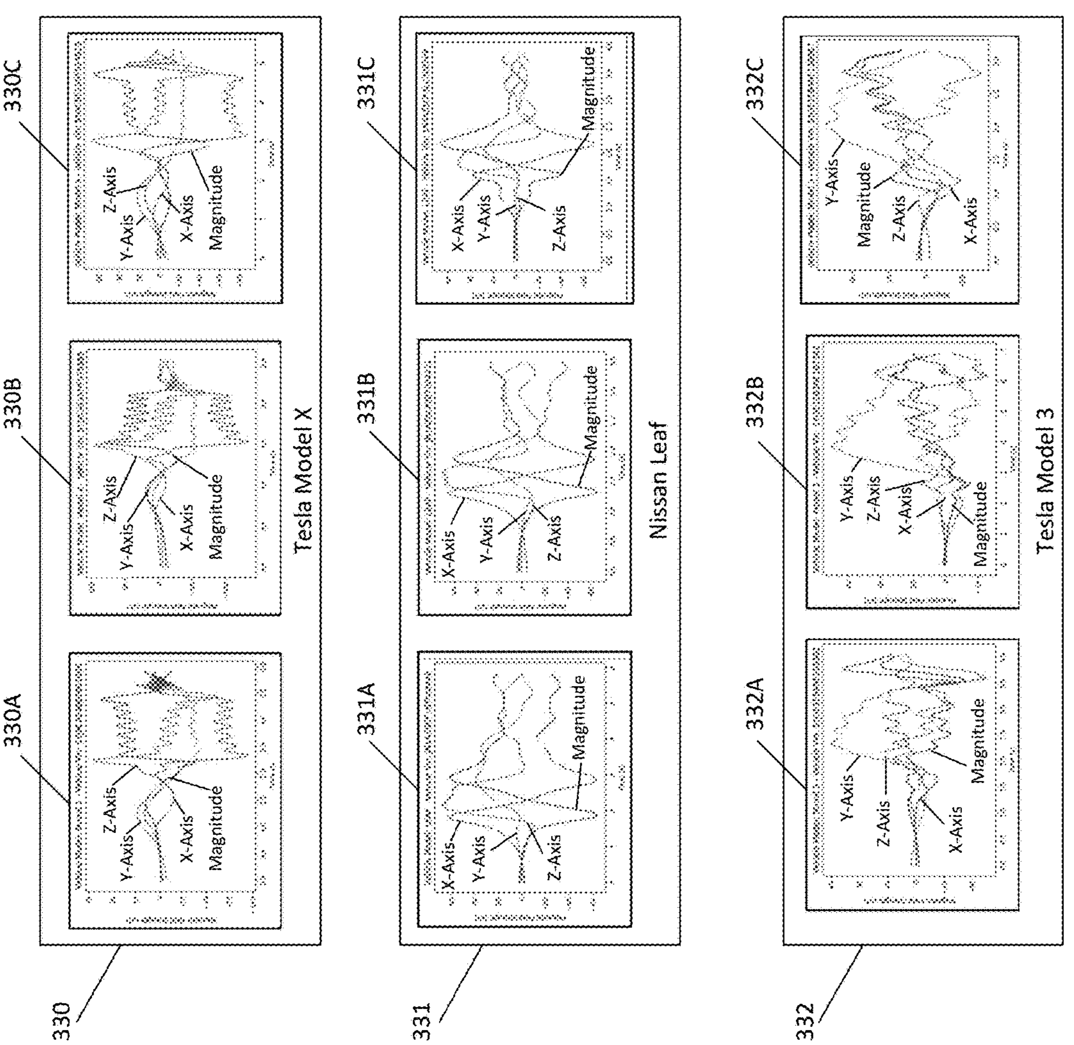
FIG. 3G includes magnetic sensor recordings of different electric vehicle models, in accordance with some embodiments of the technology described herein.
Figure 3H:
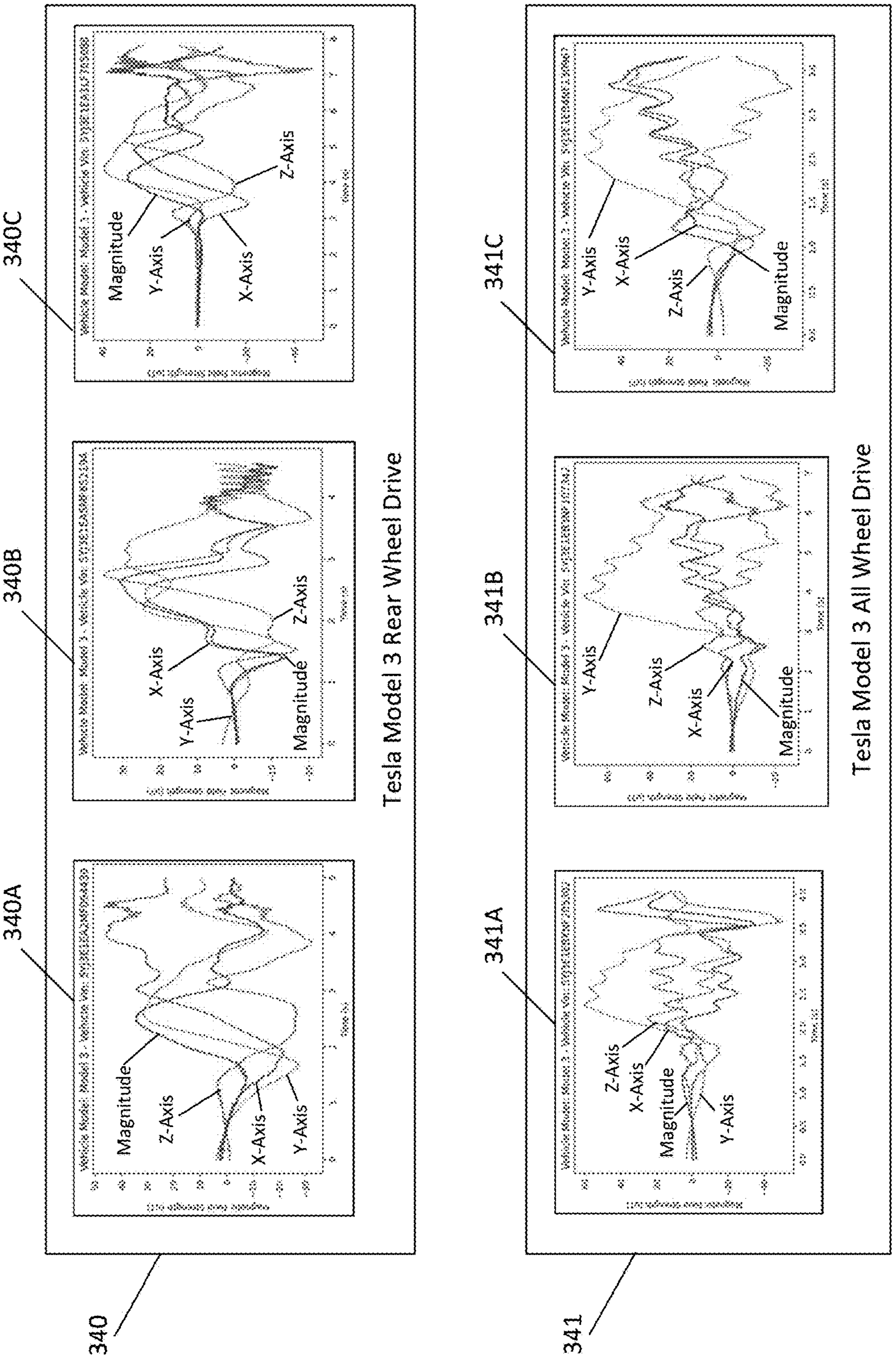
FIG. 3H illustrates measurements associated with vehicles of the same model with different drivetrains, in accordance with some embodiments of the technology described herein.
Figure 3I:
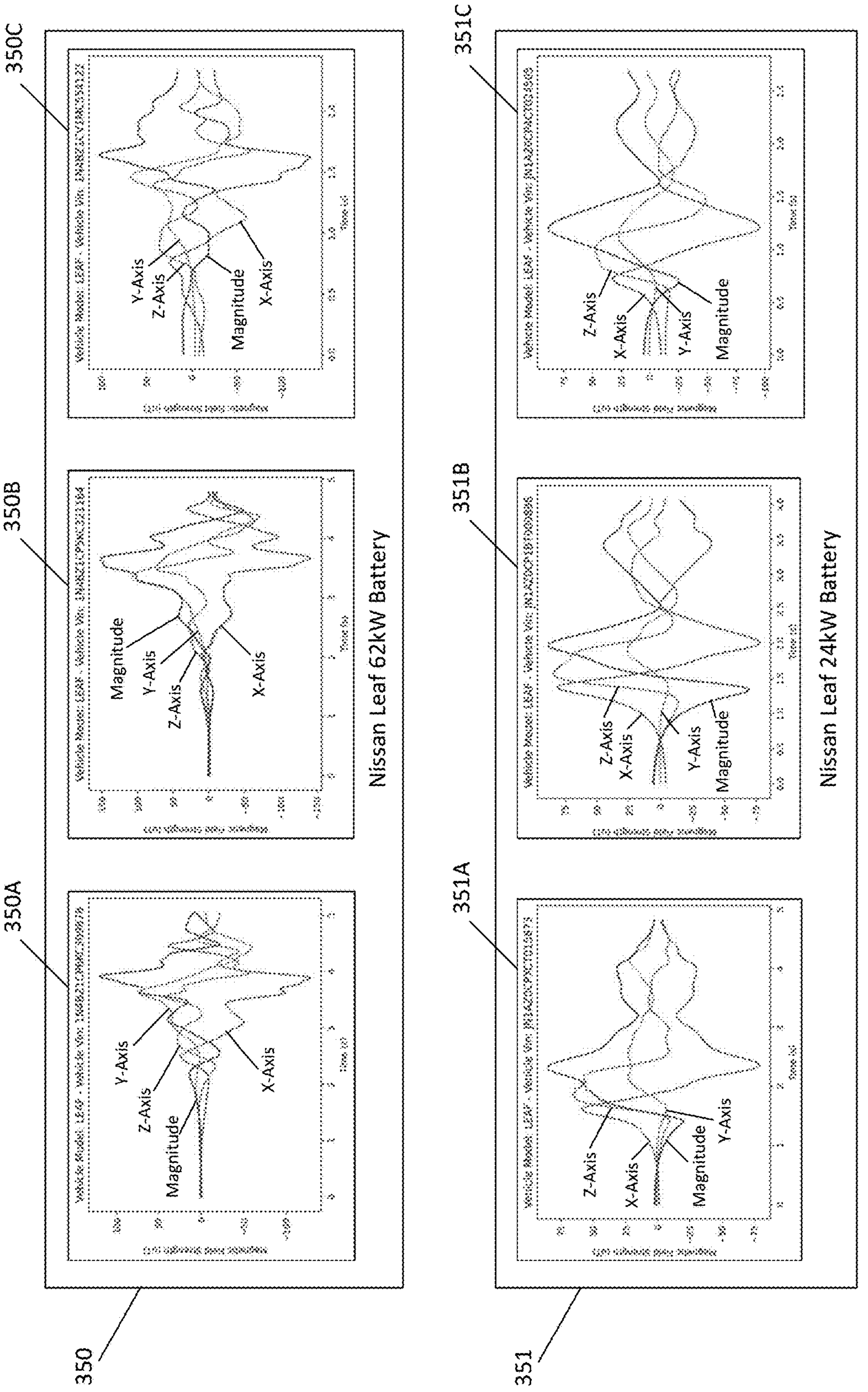
FIG. 3I illustrates measurements associated with vehicles of the same model with different battery types, in accordance with some embodiments of the technology described herein.

FIGS. 3G-3I include time series of magnetic field measurements recorded from vehicles using a vehicle inspection device, as described herein. These magnetic field measurements may be analyzed to determine characteristics of the vehicle, which may improve the accuracy and efficiency of vehicle analyses, as discussed herein.

FIG. 3G includes magnetic sensor recordings of different electric vehicle models, in accordance with some embodiments of the technology described herein. As described above, it is difficult to determine vehicle characteristics from external viewing of electric vehicles, and magnetic field measurements may be used to assist in determining the characteristics of vehicles. Magnetic field measurements may also be used to determine the condition of components of vehicles, for example motors, electronic components, alternators, AC compressors, structural components, and other components. FIG. 3G illustrates the ability to determine a vehicle model characteristic from the magnetic field measurements recorded from a vehicle.

The magnetic field measurements of three different electrical vehicle models are shown. The magnetic field measurements may have been recorded using a vehicle inspection system, such as vehicle inspection device 310 described above. The measurements may have been recorded using a magnetic sensor of a mobile device supported by the vehicle inspection system or by a magnetic sensor integrated into the vehicle inspection device. The magnetic field measurements include measurements 330 of a Tesla Model X, measurements 331 of a Nissan Leaf and measurements 332 of a Tesla Model 3.

Each graph of measurements includes four magnetic field measurements, a measurement along an X-axis, a measurement along a Y-axis, a measurement along a Z-axis and a magnitude measurement which incorporates the measurements along the X, Y, and Z-axes. The X-axis, Y-axis, Z-axis, and magnitude measurements are labeled in each graph of measurements.

Measurements 330 include measurements 330A, 330B, and 330C, each of which were measured on a different Tesla Model X. While the measurements taken from the three Tesla Model X's are not identical, there are many similarities which exist between the three. For example, the X-axis measurements begin with a dip below 0 uT, then increase above 0 uT, then dips to about −100 uT where the value oscillates and finally returns to at or just above 0 uT. This pattern in the X-axis measurements can be seen in measurements 330A, 330B, and 330C. The Y-axis measurements also show similarities across measurements 330A, 330B and 330C, in which the measurements begin by increasing to about 25 uT, dipping to about −50 uT, oscillating at about −50 uT, and increasing slightly to near 0 uT. The Z-axis measurements begin with an increase to about 25 uT, followed by a drop to about 0 uT, a spike to about 75 uT, an oscillating decrease to about −20 uT, a dip to −50 uT and an increase to about 0 uT. Finally, the magnitude measurements have similarities in their patterns, with measurements 330A and 330B beginning with an increase to about 25 uT, and measurements 330C, dipping just below 0 uT at the start. Measurements 330A, 330B and 330C then follow a similar pattern, in which the magnitude measurements dip below 0 uT, to about −50 uT, followed by an increase to and oscillations at about 50 uT, ending with a decrease to about 0 uT.

Differences among the magnetic fields measured for the vehicles associated with measurements 330A, 330B and 330C may be due to minor differences in the construction of the three vehicles, an alignment of the vehicle with the magnetic sensor or vehicle inspection device, the speed the vehicle passes over the vehicle inspection device, and the angle the vehicle passes over the vehicle inspection device, among other factors.

Measurements 331 include measurements 331A, 331B and 331C, each of which were measured on different Nissan Leaf vehicles. Measurements 331A, 331B and 331C have similar patterns, which are associated with the vehicle model, similar to the Tesla Model X described above. The patterns can be seen in the X, Y, and Z-axis and magnitude measurements. The X-axis measurements of measurements 331A, 331B and 331C begin with a spike to about 60 uT, followed by a drop to −60 uT, followed by slow oscillations at about −20 uT. The Y-axis measurements of measurements 331A, 331B and 331C begin with a small increase and a small decrease, followed by a larger increase to about 30 uT, a drop to about −15 uT, and small, slow oscillations between −5 and 10 uT. The Z-axis measurements begin with a small dip to about −10 uT, followed by an increase to about 60 uT, oscillations at 60 uT, a decrease to at or just under 0 uT and an increase to about 15 uT and small, slow oscillations. The magnitude measurements of measurements 331A, 331B and 331C also have similarities, beginning with a decrease to about −60 uT, followed by an increase to about 60 uT, a decrease to about 15 uT, and small, slow oscillations at about 15 uT.

Measurements 332 include measurements 332A, 332B, and 332C, each of which was measured on a different Tesla Model 3. Measurements 331A, 331B and 331C have similar patterns which are associated with the vehicle model, similar to the vehicles described above. The patterns can be seen in the X, Y, and Z-axis and magnitude measurements of magnetic fields recorded as the vehicles pass over a vehicle inspection device. The X-axis measurements follow a general trend of oscillations sloping upwards and increasing in magnitude. The Y-axis measurements begin with a steady decrease to about −15 uT followed by an increase to about 60 uT, followed by oscillations sloping downwards, and a decrease to about 0 uT. The Z-axis measurements begin with a slight increase to about 10 uT, followed by oscillations sloping downwards and increasing in magnitude. The magnitude measurements may begin with a decrease to about −20 uT and oscillations sloping upwards to at or about 0 uT.

As should be clear from the above discussion and the measurements 330, 331 and 332, have different patterns and features from each other and the individual vehicle measurements within each of measurements 330, 331 and 332 have similar patterns and features. Based on this, the vehicle model can be discerned from magnetic sensor measurements taken as the vehicle passes over a vehicle inspection device, as described herein.

Additional vehicle characteristics may be determined from magnetic sensor measurements recorded as a vehicle passes over a vehicle inspection system. FIG. 3H illustrates measurements associated with vehicles of the same model with different drivetrains, in accordance with some embodiments of the technology described herein.

Shown are magnetic field measurements from Tesla Model 3s having either rear wheel drive (RWD) or all-wheel drive (AWD). As described herein, vehicles having different components or characteristics may produce different magnetic fields, because the different electrical component layouts result in different magnetic fields being generated.

Similar to the discussion of the vehicle models above, vehicles having the same drivetrain will produce similar magnetic field recordings to each other. Additionally, vehicles with different drivetrains will produce different magnetic field recordings to each other.

Measurements 340 were recorded from different Tesla Model 3s with rear wheel drive, and include measurements 340A, 340B and 340C. Measurements 340A, 340B and 340C have similar patterns, which are associated with the vehicle drivetrain. The patterns can be seen in the X, Y, and Z-axis and magnitude measurements of magnetic fields recorded as the vehicles pass over a vehicle inspection device. The X-axis measurements begin with a dip below 0 uT, followed by an increase to about 30 uT, a drop, an increase to about 30 uT, oscillations and a dip. The Y-axis measurements begin with a slight dip followed by an increase to about 30 uT, a drop to about 0 uT, and oscillations. The Z-axis measurements begin with an increase, followed by a dip to about −20 uT, a spike, a decrease to about −20 uT and oscillations which slope upwards. The magnitude measurements begin with a slight decrease, followed by an increase to about 40 uT, a drop to about −10 uT and oscillations between −10 and 10 uT. There are some variations between the individual Tesla Model 3 RWD vehicles which could be caused by slight variations in vehicle construction, or the speed or angle at which the vehicles are driven over the vehicle inspection device.

Measurements 341 were recorded from different Tesla Model 3s with all wheel drive, and include measurements 341A, 341B and 341C. Measurements 341A, 341B and 341C have similar patterns, which are associated with the vehicle drivetrain. The patterns can be seen in the X, Y, and Z-axis and magnitude measurements of magnetic fields recorded as the vehicles pass over a vehicle inspection device. The X-axis measurements begin with a slight dip to about −10 uT, followed by oscillations slopping upwards, a dip below 0 uT and an increase to above 0 uT. The Y-axis measurements begin with a dip below 0 uT, followed by an increase to about 60 uT, oscillations sloping downwards and a drop to 0 uT. The Z-axis measurements begin with a slight increase above 0 uT, followed by a dip, an increase to about 20 uT, oscillations sloping downwards and an increase to about 0 uT. The magnitude measurements begin with a slight dip, followed by oscillations sloping upwards, and a decrease to about 0 uT. There are some variations between the individual Tesla Model 3 AWD vehicles which could be caused by slight variations in vehicle construction, or the speed or angle at which the vehicles are driven over the vehicle inspection device.

As should be clear from the above discussion, the measurements 340 and 341 have different patterns and characteristics. Additionally, the individual vehicle measurements within each of measurements 340 and 341 have similar patterns and characteristics to each other. Therefore, the vehicle drivetrain can be discerned from magnetic sensor measurements taken as the vehicle passes over a vehicle inspection device, as described herein.

Additional vehicle characteristics may be determined from magnetic sensor measurements recorded as a vehicle passes over a vehicle inspection system including the battery type of the vehicle. FIG. 3I illustrates measurements associated with vehicles of the same model with different battery types, in accordance with some embodiments of the technology described herein.

Shown are magnetic field measurements from Nissan Leafs having either rear a 62 kw battery or a 24 kw battery. As described herein, vehicles having different components or characteristics may produce different magnetic fields, because the different electrical component layouts result in different fields being generated.

Similar to the discussion of the vehicle models and drivetrains above, vehicles having the same battery type will have similar magnetic sensor measurements to each other and different magnetic sensor measurements from vehicles with different batteries.

FIG. 3I includes measurements 350, taken from different Nissan Leafs with 62 kw batteries and measurements 351 taken from different Nissan Leafs with 24 kW batteries. Measurements 350 include measurements 350A, 350B and 350C, each of which include X, Y, and Z-axis and magnitude measurements of magnetic fields recorded as the vehicles pass over a vehicle inspection device. These measurements have similar patterns and features. The X-axis measurements of measurements 350 begin with a slight decrease followed by an increase, a dip to about −20 uT, an increase to 0 uT, a dip to below −100 uT, an increase to about −50 uT, a dip and an increase to over 0 uT. The Y-axis measurements begin with a slight increase to about 20 uT, followed by an increase to about 70 uT, a dip to about −50 uT, and an increase to 0 uT. The Z-axis measurements begin with a slight dip followed by an increase to about 30 uT, a dip to 0 uT, an increase to about 50 uT, a dip to −50 uT, an increase to −30 uT, a dip and an increase to about 0 uT. The magnitude measurements begin with slow oscillations increasing in size and sloping upwards until about 120 uT, followed by dips and slight increases down to about 0 uT. The measurements 350A, 350B and 350C have many similarities which indicate they are from a vehicle with the same battery type.

FIG. 3I also includes measurements 351, taken from different Nissan Leafs with 24 kw batteries, which include measurements 351A, 351B and 351C. Each of measurements 351A, 351B and 351C include X, Y, and Z-axis and magnitude measurements of magnetic fields recorded as the vehicles pass over a vehicle inspection device. These measurements have similar patterns and features. The X-axis measurements begin with an increase to about 60 uT, followed by a decrease to about −75 uT, an increase to about 0 uT, a decrease to −30 uT, and in increase to 0 uT. The Y-axis measurements begin with a slight decrease, followed by an increase to about 25 uT, a decrease to about 0 uT, an increase to 20 uT and a decrease to about 0 uT. The Z-axis measurements begin with a slight decrease followed by an increase to about 70 uT, a decrease to 0 uT, an increase t bout 15 uT, a decrease to 0 uT and a slight increase. The magnitude measurements begin with a decrease to at or below 25 uT, followed by an increase to 75 uT, a decrease to 0 uT, an increase to 50 uT, and a decrease to 0 uT. The measurements 351A, 351B and 351C have many similarities which indicate they are from a vehicle with the same battery type.

As should be clear from the above discussion, the measurements 350 and 351 have different patterns and characteristics. Additionally, the individual vehicle measurements within each of measurements 350 and 351 have similar patterns and characteristics. Therefore, the vehicle battery type can be discerned from magnetic sensor measurements taken as the vehicle passes over a vehicle inspection device, as described herein.

Magnetic field measurements may additionally be used to determine vehicle conditions. Vehicle conditions may include the condition of vehicle parts, and the proper identification of vehicle conditions may improve the accuracy and value of vehicle inspections and reports. Vehicle conditions may be determined on electric, internal combustion engine and hybrid vehicles. On electric and hybrid vehicles, conditions of components such as the motors, battery, and AC pumps, among other components may be determined based on magnetic field measurements. These conditions may include damaged magnets, misaligned windings, and/or inadequate cooling within the motors. Such conditions are not easily analyzed without disassembly and/or in-depth analysis of the vehicle components, which is not a part of a standard vehicle inspection. A machine learning model may be trained on vehicles with known conditions and vehicles in good working condition, and the model may then analyze magnetic field recordings from a vehicle to determine conditions of the vehicle.

Additionally, magnetic field measurements from vehicles with internal combustion engines (ICE) may be obtained and analyzed to determine vehicle conditions. Vehicle conditions may include the conditions of different parts of the vehicle. These measurements may be related to electronic components on these ICE vehicles such as alternators, AC pumps and compressors and other components, which generate magnetic fields from the electric current passing through. These conditions may include worn-out brushes, damaged windings, or faulty voltage regulators of alternators, and malfunctioning electromagnetic clutches, damaged components, or incorrect field engagement of AC pumps and compressors. A machine learning model may be trained on vehicles with known conditions and vehicles in good working condition, and the model may then analyze magnetic field recordings from a vehicle to determine conditions of the vehicle.

Magnetic field measurements may also be used to determine the condition of non-electronic components of vehicles, including electric, ICE and hybrid vehicles. Metallic vehicle components such as frame components, wheels, and suspension components may generate magnetic fields, or can be induced to generate magnetic fields. These magnetic fields can be recorded, as described herein, and analyzed to determine one or more properties of the vehicle components. For example, the magnetic field measurements can be analyzed to determine structural damage to the components, holes in the vehicle frames and/or the presence of rust (e.g., surface rust or structural rust) on the components.

Figure 4:
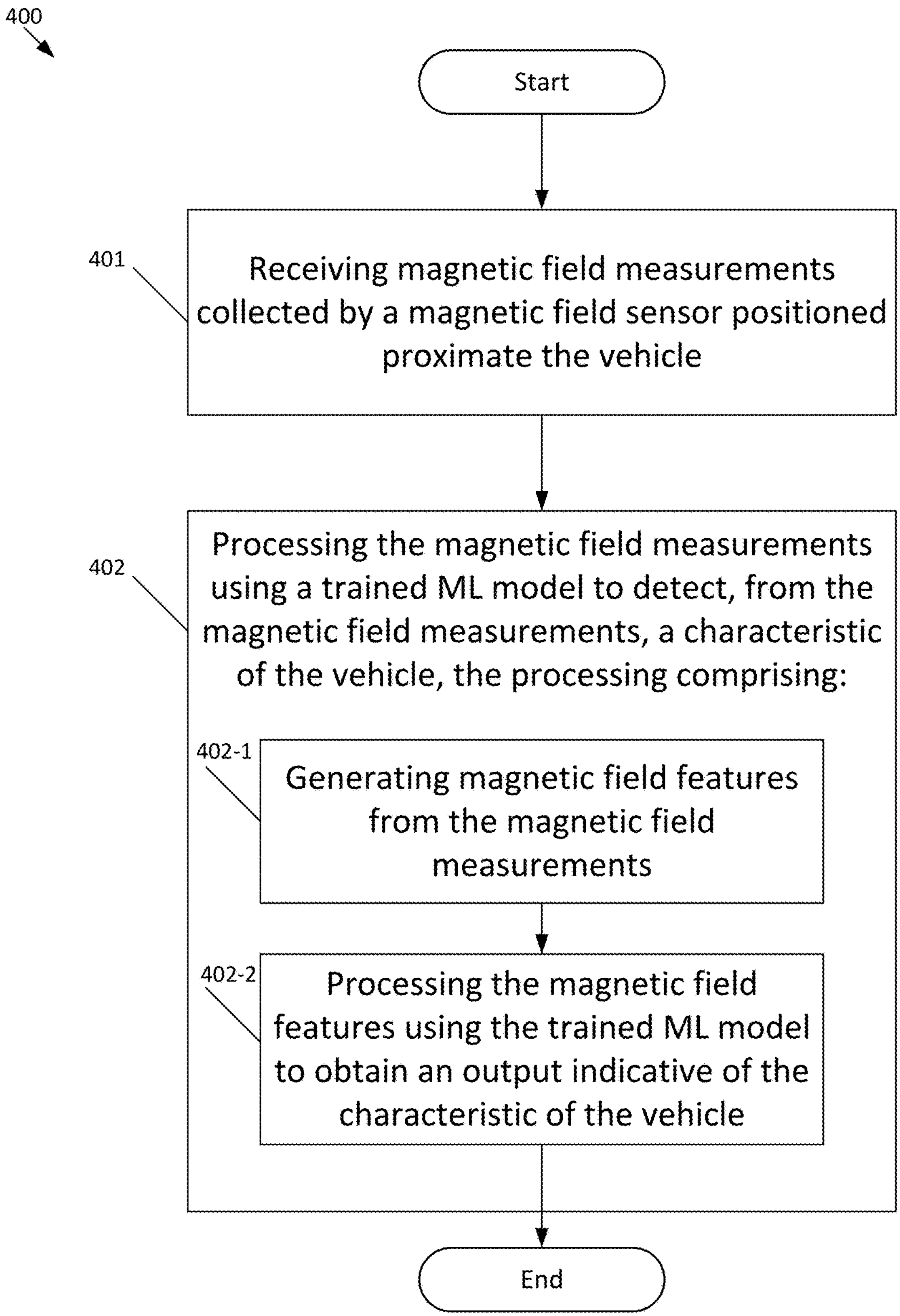
FIG. 4 is a flowchart of an illustrative process 400 for using a trained machine learning model to determine a characteristic of a vehicle from magnetic field measurements recorded from the vehicle, in accordance with some embodiments of the technology described herein.

FIG. 4 is a flowchart of an illustrative process 400 for using a trained machine learning model to determine a characteristic of a vehicle from magnetic field measurements recorded from the vehicle, in accordance with some embodiments of the technology described herein. Process 400 may be executed by any suitable computing device(s). For example, process 400 may be executed by a mobile device (e.g., mobile device 114), a server or servers (e.g., server(s) 144), or any other suitable computing device(s) including any of the devices described herein including with reference to FIG. 1 or FIG. 6.

Process 400 begins at act 401 by receiving magnetic field measurements collected by a magnetic field sensor positioned proximate the vehicle. The measurements may be collected by a mobile device of vehicle inspection device, having one or more magnetic sensors integrated therein. The magnetic sensor may be the magnetometer of a smartphone positioned proximate the vehicle. The measurements may me recorded as discussed with relation to FIGS. 3A-I. The magnetic field measurements may be recorded as a time series of measurements. The measurements may be preprocessed, for example by cropping the measurements, zero-padding the measurements, and/or normalizing the measurements, as discussed herein. The measurements may comprise a time series of measurements for multiple magnetic field measurement axes. For example, the measurements may comprise a time series of magnetic field measurements for one or more of an X, Y, or Z-axis the measurements were recorded relative to.

Next, process 400 proceeds to act 402, in which the magnetic field measurements are processed using the trained ML model to detect, from the magnetic field measurements, a characteristic of the vehicle. Act 402 comprises: generating magnetic field features from the magnetic field measurements at act 402-1 and processing the magnetic field features using the trained ML model to obtain an output indicative of the characteristic of the vehicle at act 402-2.

In some embodiments, the trained machine learning model may be a one dimensional trained neural network, trained to analyze magnetic field measurements. In some examples, the trained machine learning model is a convolutional neural network. The trained machine learning model may be structured and function as discussed with regard to FIGS. 5A-C.

The characteristic of the vehicle detected in act 402 may include a make and model of the vehicle, a drivetrain of the vehicle, and a battery type of the vehicle, among other vehicle conditions, as described herein.

The one or more trained machine learning models may include a number of trainable and non-trainable parameters. Accordingly, processing the magnetic field measurements using the one or more trained machine learning models to obtain the output indicative of the characteristic of the vehicle may include computing the output of the model using the values of the number of parameters and the magnetic field measurements. In some embodiments, the one or more trained machine learning models includes between 100,000 and 1 million parameters, 100,000 and 10 million parameters, 100,000 and 750,000 parameters, 250,000 and 500,000 parameters, or 300,000 and 500,000 parameters. For example, the one or more trained machine learning models may include approximately 488,000 trainable parameters and no non-trainable parameters.

In some embodiments, the output of the machine learning model may be a probability distribution indicative of the probability the recorded vehicle has a particular characteristic. For example, the output may include a probability of each possible class or category for the particular characteristic of the vehicle. The sum of these probabilities may sum to 1 and the class or category with the highest probability may be selected as the characteristic of the vehicle.

Following act 402, process 400 concludes. Accordingly, following the conclusion of process 400, the output may be provided to an inspector or otherwise included in a vehicle condition report that may include information on the characteristic of the vehicle.

In some examples, additional actions may be performed following act 402. For example, a vehicle condition report may be generated based on the outputs of the machine learning model. In some examples, the vehicle condition report may be transmitted via at least one communication network to a remote device, such as a device of an inspector of the vehicle or one or more reviewers. In some examples, an online auction of the vehicle may be initiated following the review process of the vehicle condition report.

Figure 5A:
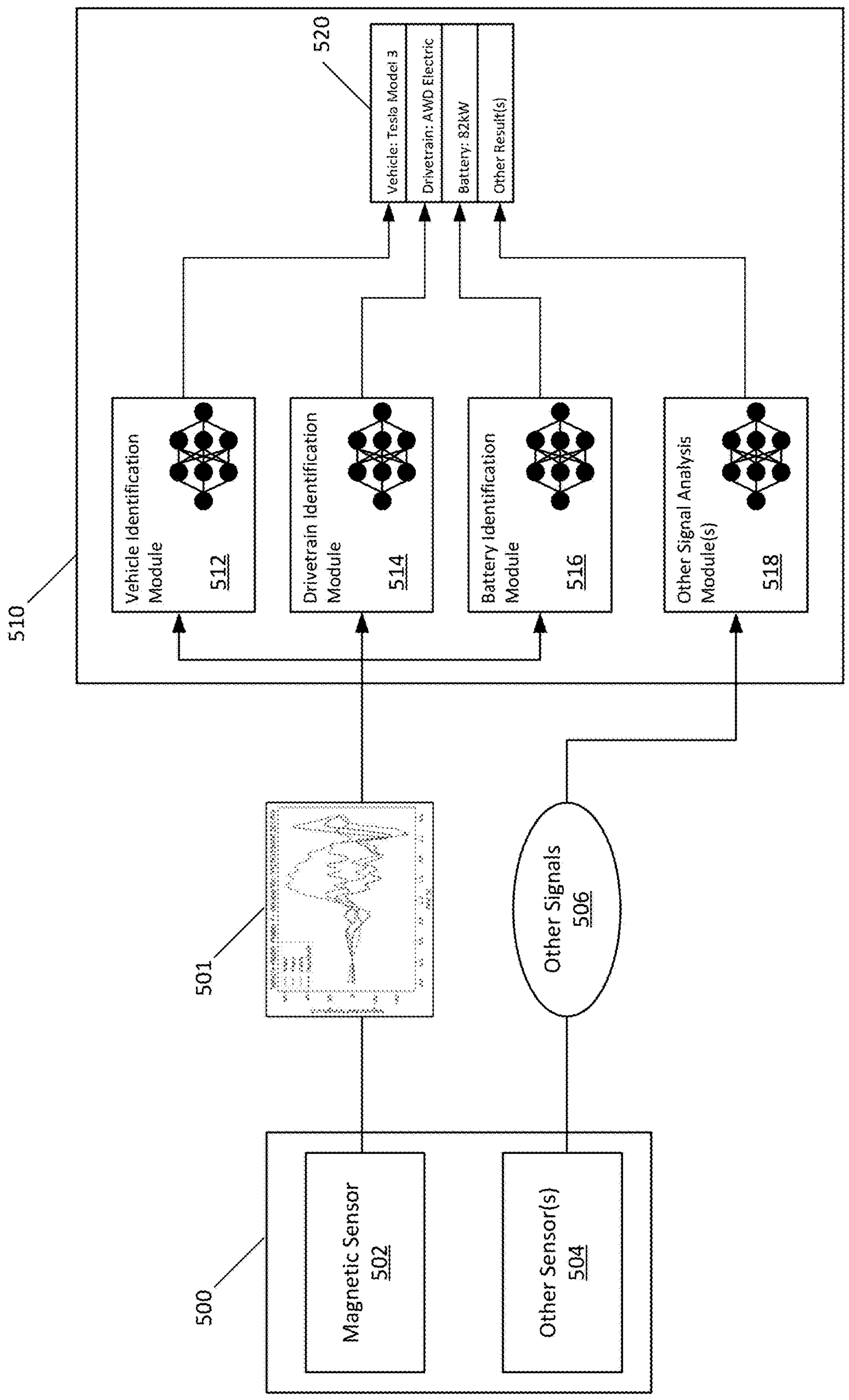
FIG. 5A illustrates a system configured with a trained machine learning model for analyzing vehicles, in accordance with some embodiments of the technology described herein.

FIG. 5A illustrates a system configured with a trained machine learning model for analyzing vehicles, in accordance with some embodiments of the technology described herein. The system includes vehicle inspection device 500, and server 510.

Vehicle inspection device 500 may include one or more magnetic sensors 502, and other sensors 504. The other sensors 504 may include a camera, and a microphone, among other sensors, as described herein. The sensors of the vehicle inspection device 500 may be integrated into a mobile device which is supported by the vehicle inspection device, or integrated into the vehicle inspection device, as described herein. The sensors may record signals from a vehicle. The signals may be recorded as the vehicle passes over the vehicle inspection device 500. The signals may include magnetic field measurements 501, recorded from magnetic sensor(s) 502, and other signals 506, recorded from other sensors 504. The signals may be transmitted to server 510, using any suitable method, as described herein.

Server 510 may store one or more machine learning models for analyzing the received signals. In some embodiments, the one or more machine learning models may be stored within vehicle inspection device 500 or a mobile device supported by vehicle inspection device 500. In FIG. 5A, server 510 contains one or multiple machine learning models for analyzing signals received from vehicle inspection device 500. Server 510 includes vehicle identification module 512, drivetrain identification module 514, battery identification module 516, and other signal analysis module (s) 518, each of which may include a respective machine learning module. The vehicle identification module 512, drivetrain identification module 514, and battery identification module 516 receive magnetic field measurements 501 from the magnetic sensor(s) 502 of the vehicle inspection device 500.

In some embodiments, the vehicle inspection device 500 may have multiple magnetic sensors, and the data from the multiple magnetic sensors may be processed by the same machine learning models, such as models within vehicle identification module 512, drivetrain identification module 514, and battery identification module 516. In some embodiments, the vehicle inspection device may have multiple magnetic sensors and the data from each of the multiple magnetic sensors may be processed by a respective machine learning model or set of machine learning models. For example, data from each of the multiple magnetic sensors may be processed be a respective vehicle identification model, drivetrain identification model, battery identification model, and/or any other ML model or combination of ML models as described herein.

In some embodiments, other signal analysis module(s) 518 may include a single ML model which analyzes data from other sensors 504. In some embodiments, other signal analysis module(s) 518 may include multiple ML models which analyze signals from one or more of other sensors 504.

The machine learning models, include models within vehicle identification module 512, drivetrain identification module 514, battery identification module 516 and other signal analysis module(s) 518, may be trained on data recorded from vehicles using a vehicle inspection device, as described herein. Models within vehicle identification module 512, drivetrain identification module 514, battery identification module 516 may be trained on magnetic field data. The magnetic field data used for training may be tagged with one or more characteristics associated with the particular vehicle, for example the model of vehicle identification module 512 may be trained on magnetic field data tagged with an associated make and model, the model of drivetrain identification module 514 may be trained on magnetic field data tagged with an associated vehicle drivetrain type, the model of battery identification module 516 may be trained on magnetic field data tagged with an associated batter type. In some examples, ML models may be trained on magnetic field data recorded by magnetic sensors positioned in the same or similar location as the one or more magnetic sensors 502 within vehicle inspection device 500.

The models of other signal analysis module(s) 518 may be trained on vehicle signal data recorded from vehicles using a vehicle inspection device, as described herein. The vehicle signal data used for training may come from the same type of sensors as the other sensors 504 and may be tagged with one or more characteristics associated with the particular vehicle. The tags may be applied to the measurements by individuals who inspected the vehicles to confirm the associate one or more characteristics.

In some embodiments, the trained machine learning models, including the models of vehicle identification module 512, drivetrain identification module 514, battery identification module 516, and other signal analysis module(s) 518, may be one-dimensional convolutional neural networks. Though, it should be appreciated that in other embodiments, other types of neural networks and/or other types of machine learning models may be used instead of 1D convolutional neural networks, as aspects of the technology described herein are not limited in this respect.

Table 1 below illustrates an example architecture of a neural network model which may be the architecture of the trained machine learning models including the models of vehicle identification module 512, drivetrain identification module 514, battery identification module 516 and other signal analysis module(s) 518, in accordance with some embodiments of the technology described herein.

TABLE 1

1D Convolutional Neural Network Model

| Line # | Sample Code |
|---|---|
| 1. | CNN1D( |
| 2. | (module): Sequential( |
| 3. | (0): Sequential( |
| 4. | (0): Conv1d(3, 32, kernel_size=(7,), stride=(1,), padding=(3,)) |
| 5. | (2): LeakyReLU(negative_slope=0.01) |
| 6. | (3): Dropout1d(p=0.1, inplace=False) |
| 7. | ) |
| 8. | (1): Sequential( |
| 9. | (0): Conv1d(32, 32, kernel_size=(7,), stride=(1,), padding=(3,)) |
| 10. | (1): BatchNorm1d(32, eps=1e−05, momentum=0.1, affine=True, track_running_stats=True) |
| 11. | (2): LeakyReLU(negative_slope=0.01) |
| 12. | (3): Dropout1d(p=0.1, inplace=False) |
| 13. | ) |
| 14. | (2): MaxPool1d(kernel_size=3, stride=3, padding=0, dilation=1, ceil_mode=False) |
| 15. | (3): Sequential( |
| 16. | (0): Conv1d(32, 64, kernel_size=(7,), stride=(1,), padding=(3,)) |
| 17. | (1): BatchNorm1d(64, eps=1e−05, momentum=0.1, affine=True, track_running_stats=True) |
| 18. | (2): LeakyReLU(negative_slope=0.01) |
| 19. | (3): Dropout1d(p=0.1, inplace=False) |
| 20. | ) |
| 21. | (4): Sequential( |
| 22. | (0): Conv1d(64, 64, kernel_size=(7,), stride=(1,), padding=(3,)) |
| 23. | (1): BatchNorm1d(64, eps=1e−05, momentum=0.1, affine=True, track_running_stats=True) |
| 24. | (2): LeakyReLU(negative_slope=0.01) |
| 25. | (3): Dropout1d(p=0.1, inplace=False) |
| 26. | ) |
| 27 | (5): MaxPool1d(kernel_size=3, stride=3, padding=0, dilation=1, ceil_mode=False) |
| 28. | (6): Sequential( |

TABLE 1-continued

1D Convolutional Neural Network Model

| Line # | Sample Code |
|---|---|
| 29. | (0): Conv1d(64, 128, kernel_size=(7,), stride=(1,), padding=(3,)) |
| 30. | (1): BatchNorm1d(128, eps=1e−05, momentum=0.1, affine=True, track_running_stats=True) |
| 31. | (2): LeakyReLU(negative_slope=0.01) |
| 32. | (3): Dropout1d(p=0.1, inplace=False) |
| 33. | ) |
| 34. | (7): Sequential( |
| 35. | (0): Conv1d(128, 128, kernel_size=(7,), stride=(1,), padding=(3,)) |
| 36. | (1): BatchNorm1d(128, eps=1e−05, momentum=0.1, affine=True, track_running_stats=True) |
| 37. | (2): LeakyReLU(negative_slope=0.01) |
| 38. | (3): Dropout1d(p=0.1, inplace=False) |
| 39. | ) |
| 40. | (8): MaxPool1d(kernel_size=3, stride=3, padding=0, dilation=1, ceil_mode=False) |
| 41. | (9): Sequential( |
| 42. | (0): Conv1d(128, 256, kernel_size=(7,), stride=(1,), padding=(3,)) |
| 43. | (1): BatchNorm1d(256, eps=1e−05, momentum=0.1, affine=True, track_running_stats=True) |
| 44. | (2): LeakyReLU(negative_slope=0.01) |
| 45. | (3): Dropout1d(p=0.1, inplace=False) |
| 46. | ) |
| 47. | (10): AdaptiveAvgPool1d(output_size=1) |
| 48. | (11): Flatten(start_dim=1, end_dim =−1) |
| 49. | (12): FullyConnected( |
| 50. | (module): Sequential( |
| 51. | (0): Sequential( |
| 52. | (0): Linear(in_features=256, out_features=128, bias=True) |
| 53. | (1): LeakyReLU(negative_slope=0.01) |
| 54. | (2): BatchNorm1d(128, eps=1e−05, momentum=0.1, affine=True, track_running_stats=True) |
| 55. | (3): Dropout(p=0.3, inplace=False) |
| 56. | ) |
| 57. | (1): Linear(in_features=128, out_features=5, bias=True) |
| 58. | ) |
| 59. | ) |
| 60. | ) |
| 61. | ) |
| 62. | torch.Size([3, 3, 600]) --> torch.Size([3, 5]) |

Table 2 below illustrates an example of the layers of a machine learning model which may be used for the trained machine learning models of vehicle identification module 512, drivetrain identification module 514, battery identification module 516 and other signal analysis module(s) 518, in accordance with embodiments of the technology described herein.

TABLE 2

Machine Learning Model Layers

| Layer # | Layer Type | Output Shape | Param # |
|---|---|---|---|
| 1. | Conv1d-1 | [1, 32, 600] | 704 |
| 2. | BatchNorm1d-3 | [1, 32, 600] | 64 |
| 3. | LeakyReLU-3 | [1, 32, 600] | 0 |
| 4. | Dropout1d-11 | [1, 32, 600] | 0 |
| 5. | Conv1d-12 | [1, 32, 600] | 7,200 |
| 6. | BatchNorm1d-13 | [1, 32, 600] | 64 |
| 7. | LeakyReLU-14 | [1, 32, 600] | 0 |
| 8. | Dropout1d-22 | [1, 32, 600] | 0 |
| 9. | MaxPool1d-23 | [1, 32, 200] | 0 |
| 10. | Conv1d-24 | [1, 64, 200] | 14,400 |
| 11. | BatchNorm1d-25 | [1, 64, 200] | 128 |
| 12. | LeakyReLU-26 | [1, 64, 200] | 0 |
| 13. | Dropout1d-34 | [1, 64, 200] | 0 |
| 14. | Conv1d-35 | [1, 64, 200] | 28,736 |
| 15. | BatchNorm1d-36 | [1, 64, 200] | 128 |
| 16. | LeakyReLU-37 | [1, 64, 200] | 0 |
| 17. | Dropout1d-45 | [1, 64, 200] | 0 |
| 18. | MaxPool1d-46 | [1, 64, 66] | 0 |
| 19. | Conv1d-47 | [1, 128, 66] | 57,472 |

TABLE 2-continued

Machine Learning Model Layers

| Layer # | Layer Type | Output Shape | Param # |
|---|---|---|---|
| 20. | BatchNorm1d-48 | [1, 128, 66] | 256 |
| 21. | LeakyReLU-49 | [1, 128, 66] | 0 |
| 22. | Dropout1d-57 | [1, 128, 66] | 0 |
| 23. | Conv1d-58 | [1, 128, 66] | 114,816 |
| 24. | BatchNorm1d-59 | [1, 128, 66] | 256 |
| 25. | LeakyReLU-60 | [1, 128, 66] | 0 |
| 26. | Dropout1d-68 | [1, 128, 66] | 0 |
| 27. | MaxPool1d-69 | [1, 128, 22] | 0 |
| 28. | Conv1d-70 | [1, 256, 22] | 229,632 |
| 29. | BatchNorm1d-71 | [1, 256, 22] | 512 |
| 30. | LeakyReLU-72 | [1, 256, 22] | 0 |
| 31. | Dropout1d-80 | [1, 256, 22] | 0 |
| 32. | AdaptiveAvgPool1d-81 | [1, 256, 1] | 0 |
| 33. | Flatten-82 | [1, 256] | 0 |
| 34. | Linear-83 | [1, 128] | 32,896 |
| 35. | LeakyReLU-84 | [1, 128] | 0 |
| 36. | BatchNorm1d-92 | [1, 128] | 256 |
| 37. | Dropout-93 | [1, 128] | 0 |
| 38. | Linear-94 | [1, 5] | 645 |
| 39. | FullyConnected-95 | [1, 5] | 0 |

Before analysis by the machine learning models, the magnetic field measurements 501 may undergo preprocessing. The preprocessing may include resizing signals to a predetermined length. For example, signals longer than the predetermined length may be down sampled to the desired length and signals shorter than the predetermined length may be 0 padded to reach the predetermined length. In addition, preprocessing may include normalizing the magnetic field measurements 501. Normalizing may include performing mean center normalization, in which each signal's average value is subtracted from each value in the signal.

The trained machine learning models, including the models of vehicle identification module 512, drivetrain identification module 514, battery identification module 516 and other signal analysis module(s) 518, generate a respective characteristic, which are reflected in outputs 520. As shown, the vehicle identification module 512 processed the magnetic field measurements 501 and identified the vehicle as a Tesla Model 3. The drivetrain identification module 514 identified the drivetrain as an all-wheel drive electric drivetrain. The battery identification module 516 identified the battery as an 82 kw battery. The other signal analysis module(s) 518 identified other results associated with the vehicle.

Table 3 below includes receiver operating characteristic (ROC) area under curve (AUC) scores obtained for a vehicle identification machine learning model analyzing magnetic field data recorded from a vehicle identification device, for example the model of vehicle identification module 512, in accordance with embodiments of the technology described herein.

TABLE 3

ROC AUC Scores for Vehicle Identification ML Model

| Vehicle | ROC AUC |
|---|---|
| Nissan Leaf | 0.99 |
| Tesla Model 3 | 0.99 |
| Tesla Model S | 0.99 |
| Tesla Model X | 0.97 |
| Tesla Y | 0.99 |

Table 4 below includes ROC AUC scores obtained for a drivetrain type machine learning model analyzing magnetic field data recorded from a vehicle identification device, for example the model of the drivetrain identification module 514, in accordance with embodiments of the technology described herein.

TABLE 4

ROC AUC Scores for Drivetrain Identification ML Model

| Drivetrain Type | ROC AUC |
|---|---|
| All Wheel Drive | 0.93 |
| Rear Wheel Drive | 0.88 |
| Front Wheel Drive | 0.99 |

Table 5 below includes ROC AUC scores obtained for a battery type machine learning model analyzing magnetic field data recorded from a vehicle identification device, for example the model of battery identification module 516, in accordance with embodiments of the technology described herein.

TABLE 5

ROC AUC Scores for Battery Identification ML Model

| Battery Type | ROC AUC |
|---|---|
| 100 kw | 0.89 |
| 24 kw | 0.99 |
| 54 kw | 0.96 |
| 75 kw | 0.70 |
| 82 kw | 0.82 |

The outputs 520 of the ML models, including the models within vehicle identification module 512, drivetrain identification module 514, battery identification module 516 and other signal analysis module(s) 518, may be transferred to a vehicle report generation module, such as 226 as described with regard to FIG. 2, where they are included a vehicle report. The vehicle report may then be sent to third parties for analysis.

Figure 5B:
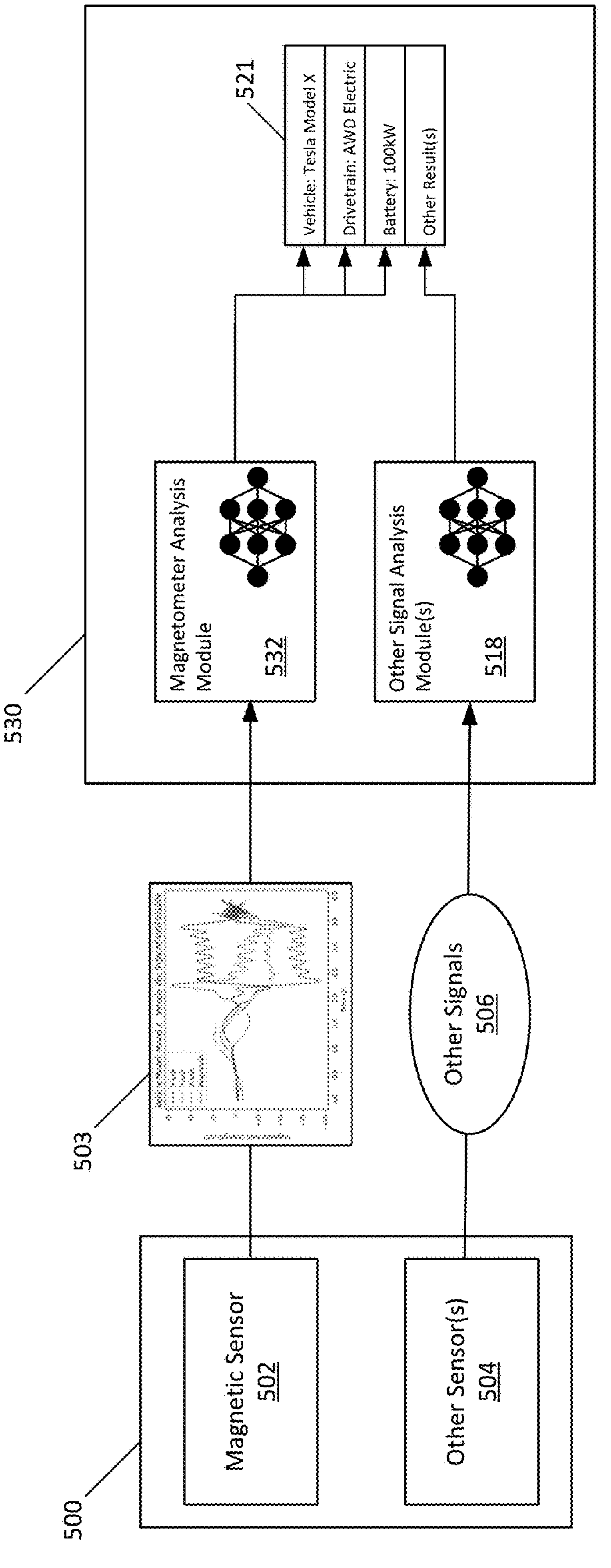
FIG. 5B illustrates another system configured with a trained machine learning model for analyzing vehicles, in accordance with some embodiments of the technology described herein.

FIG. 5B illustrates another system configured with a trained machine learning model for analyzing vehicles, in accordance with some embodiments of the technology described herein. The same reference numerals are used with reference to the same components as in FIG. 5A, and these components will not be described again with reference to FIG. 5B.

The server 530 may include machine learning models for analyzing the received magnetic field measurements 503 and output one or more characteristics of the vehicle. As shown the magnetic sensor analysis module 532 outputs the characteristics related to the vehicle type, drivetrain, and battery type, which may be generated by a model within the magnetic sensor analysis module 532. The model of the magnetic sensor analysis module 532 analyzed the magnetic field measurements 503 and determined the vehicle to be a Tesla Model X, the drivetrain to be an all-wheel drive electric drivetrain and the battery to be a 100 kw battery. Other results may be provided by models of the other signal analysis module(s) 518 which analyzes other signals 506. The model of the magnetic sensor analysis module 532 may be trained and structured as described herein, and adapted to output multiple characteristics.

The outputs 521 of the ML models of magnetic sensor 543 analysis module 532 and other signal analysis module(s) 518, may be transferred to a vehicle report generation module, such as 226 as described with regard to FIG. 2, where they are included a vehicle report. The vehicle report may then be sent to third parties for analysis.

Figure 5C:
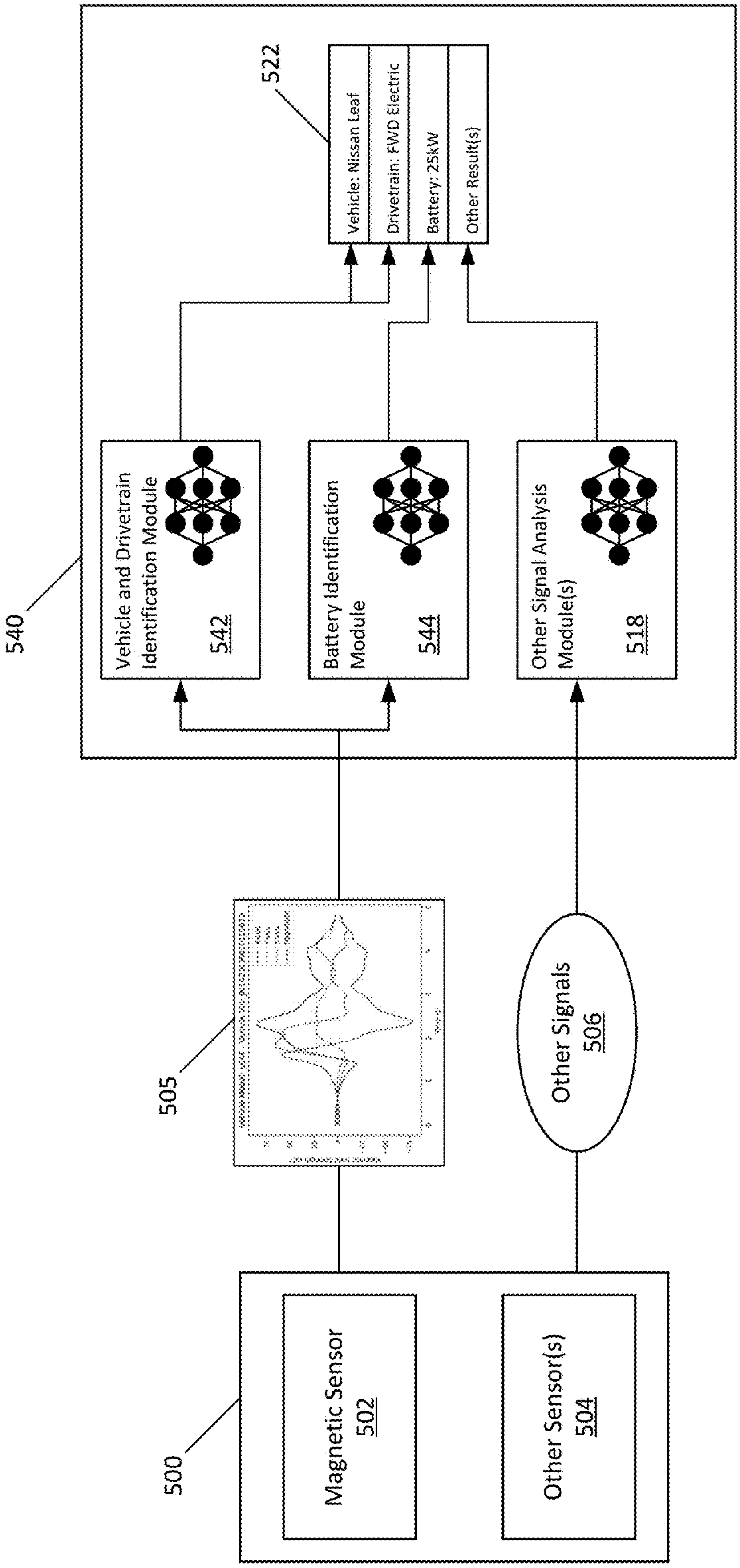
FIG. 5C illustrates yet another example system configured a trained machine learning model for analyzing vehicles, in accordance with some embodiments of the technology described herein.

FIG. 5C illustrates yet another example system configured with one or more machine learning models for analyzing vehicles, in accordance with some embodiments of the technology described herein. The same reference numerals are used with reference to the same components as in FIG. 5A, and these components will not be described again with reference to FIG. 5C.

In FIG. 5C, server 540 contains multiple machine learning models for analyzing signals received from vehicle inspection device 500. Server 540 includes vehicle and drivetrain identification module 542, battery identification module 544, and other signal analysis module(s) 518, each of which may contain a respective machine learning model. The models of each of the vehicle and drivetrain identification module 542, and battery identification module 544 receive magnetic field data 505 from the magnetic sensor(s) 502 of the vehicle inspection device 500. In the example of FIG. 5C, the motor, vehicle and drivetrain characteristics of the vehicle are determined using a machine learning model within vehicle and drivetrain identification module 542 and the battery is determined using a machine learning model within battery identification module 544. The vehicle was determined to be a Nissan Leaf and the drivetrain to be a front wheel drive drivetrain by the model within vehicle and drivetrain identification module 542, and the battery was identified to be a 25 kw battery by the model within battery identification module 544. Each of the machine learning models within vehicle and drivetrain identification module 542, battery identification module 544, and other signal analysis module(s) 518 may be trained and structured as described herein.

The outputs 522 of the vehicle and drivetrain identification module 542, battery identification module 544, and other signal analysis module(s) 518, may be transferred to a vehicle report generation module, such as 226 as described with regard to FIG. 2, where they are included a vehicle report. The vehicle report may then be sent to third parties for analysis.

In some embodiments, the machine learning models may be structured in any suitable way. For example, each characteristic of the server output may be determined by a respective machine learning model, all characteristics may be determined by a single machine learning model, some characteristics may be determined by respective machine learning models and some characteristics may be determined by a single machine learning model, and some characteristics may be determined by multiple machine learning models.

Figure 6:
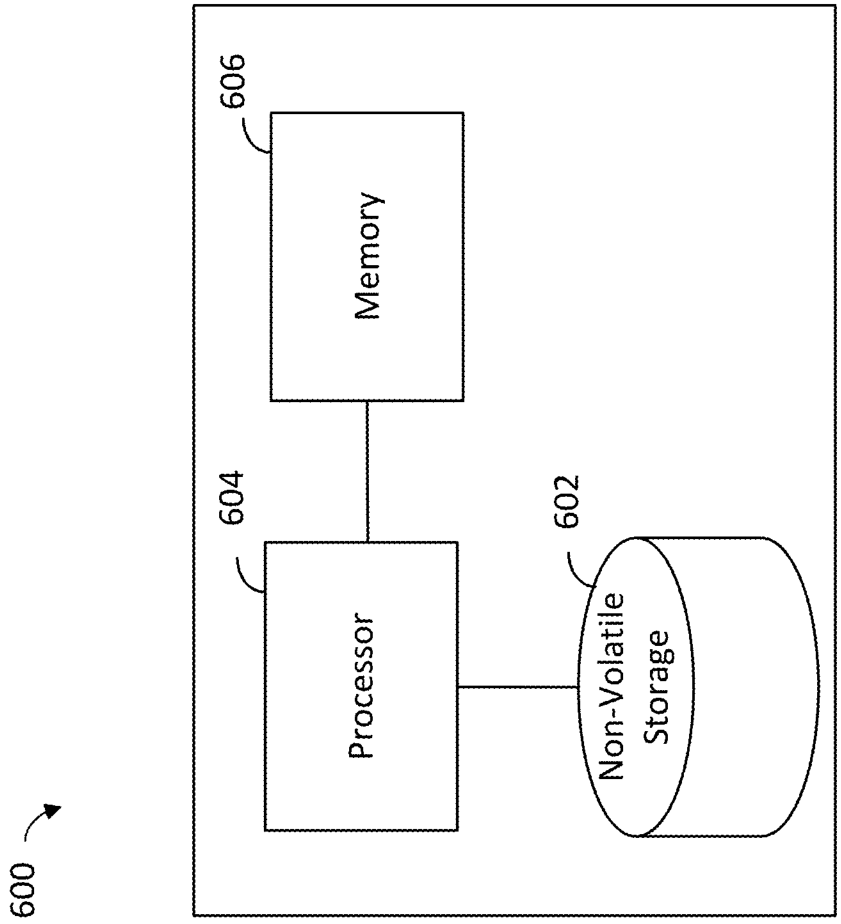
FIG. 6 illustrates a block diagram of an illustrative computing system that may be used in implementing some embodiments of the technology described herein.

FIG. 6 illustrates a block diagram of an illustrative computing system that may be used in implementing some embodiments of the technology described herein. An illustrative implementation of a computer system 600 that may be used in connection with any of the embodiments of the disclosure provided herein is shown in FIG. 6. For example, any of the computing devices described herein (e.g., 114, 126, 134, 142, 144, 129, 210, 220, 310, 500, 510) may be implemented as computer system 600. The computer system 600 may include one or more computer hardware processors 604 and one or more articles of manufacture that comprise non-transitory computer readable storage media, for example, one or more volatile storage devices 606 (e.g., random access memory or any other suitable type of memory) and/or one or more non-volatile storage devices 602 (e.g., a hard disk, a flash memory, etc.). The hardware processor(s) 604 may control writing data to and reading data from the volatile storage device(s) 606 and the non-volatile storage device(s) 602 in any suitable manner. To perform any of the functionality described herein, including with respect to any process described herein, the hardware processor(s) 604 may execute one or more processor-executable instructions stored in one or more non-transitory computer-readable storage media (e.g., the volatile storage device(s) 606 and/or non-volatile storage device(s) 602), which may serve as non-transitory computer readable storage media storing processor-executable instructions for execution by the hardware processor(s) 604.

The technology described herein is operational with numerous other general purpose or special purpose computing system environments or configurations. Examples of well-known computing systems, environments, and/or configurations that may be suitable for use with the technology described herein include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The technology described herein may also be practiced in distributed computing environments where tasks are performed by remote processing devices that are linked through a communications network. In a distributed computing environment, program modules may be located in both local and remote computer storage media including memory storage devices.

Having thus described several aspects of at least one embodiment of the technology described herein, it is to be appreciated that various alterations, modifications, and improvements will readily occur to those skilled in the art. Such alterations, modifications, and improvements are intended to be part of this disclosure, and are intended to be within the spirit and scope of disclosure. Further, though advantages of the technology described herein are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

The above-described embodiments of the technology described herein can be implemented in any of numerous ways. For example, the embodiments may be implemented using hardware, software, or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semicustom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. However, a processor may be implemented using circuitry in any suitable format.

Further, it should be appreciated that a computer may be embodied in any of a number of forms, such as a rack-mounted computer, a desktop computer, a laptop computer, a tablet computer, a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, aspects of the technology described herein may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments described above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the technology as described above. A computer-readable storage medium includes any computer memory configured to store software, for example, the memory of any computing device such as a smart phone, a laptop, a desktop, a rack-mounted computer, or a server (e.g., a server storing software distributed by downloading over a network, such as an app store)). As used herein, the term "computer-readable storage medium" encompasses only a non-transitory computer-readable medium that can be considered to be a manufacture (i.e., article of manufacture) or a machine. Alternatively, or additionally, aspects of the technology described herein may be embodied as a computer readable medium other than a computer-readable storage medium, such as a propagating signal.

The terms "program" or "software" are used herein in a generic sense to refer to any type of computer code or set of processor-executable instructions that can be employed to program a computer or other processor to implement various aspects of the technology as described above. Additionally, it should be appreciated that according to one aspect of this embodiment, one or more computer programs that when executed perform methods of the technology described herein need not reside on a single computer or processor, but may be distributed in a modular fashion among a number of different computers or processors to implement various aspects of the technology described herein.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the technology described herein may be embodied as a method, of which examples are provided herein including with reference to FIG. 4. The acts performed as part of any of the methods may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, within ±2% of a target value in some embodiments. The terms "approximately" and "about" may include the target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. A method, comprising:
using at least one computer hardware processor to perform:
receiving magnetic field measurements of a vehicle, the magnetic field measurements collected by a magnetic field sensor positioned proximate the vehicle; and
processing the magnetic field measurements using a trained ML model to detect, from the magnetic field measurements, a characteristic of the vehicle, the processing comprising:
generating magnetic field features from the magnetic field measurements; and
processing the magnetic field features using the trained ML model to obtain an output indicative of the characteristic of the vehicle, wherein the characteristic of the vehicle is a battery type in the vehicle.

2. The method of claim 1, further comprising:
collecting the magnetic field measurements using the magnetic field sensor.

3. The method of claim 2, wherein the magnetic field sensor is a magnetometer part of a smartphone positioned proximate the vehicle.

4. The method of claim 1, wherein the magnetic field measurements comprise a respective time series of measurements for each of multiple measurement axes.

5. The method of claim 4, wherein the magnetic field measurements comprise a time series of x-axis measurements, a time series of y-axis measurements, and a time-series of z-axis measurements.

6. The method of claim 1, wherein the trained ML model is further configured to output a second characteristic of the vehicle indicative of a model of the vehicle.

7. The method of claim 1, wherein the trained ML model is further configured to output a second characteristic of the vehicle indicative of a trim type of the vehicle.

8. The method of claim 1, wherein the vehicle is an electric vehicle.

9. The method of claim 1, wherein the vehicle is a hybrid vehicle.

10. The method of claim 1,
wherein the magnetic field measurements comprise a respective time series of measurements for each of multiple measurement axes, and
wherein generating magnetic field features from the magnetic field measurements comprises:
resizing each of the time series of measurements, and
normalizing each of the time series of measurements.

11. The method of claim 1, wherein the trained ML model comprises a 1-dimensional (1D) convolutional neural network (CNN) trained to detect, from magnetic field measurements of a vehicle, the characteristic of the vehicle.

12. The method of claim 11, wherein the 1D CNN comprises between 100,000 and 1 million parameters.

13. The method of claim 1, further comprising:
recording the magnetic field measurements using the magnetic field sensor; and
transmitting the magnetic field measurements via at least one communication network to a computing device comprising the at least one computer hardware processor.

14. The method of claim 1, further comprising:
generating an electronic vehicle condition report including the characteristic of the vehicle.

15. The method of claim 14, further comprising:
transmitting the electronic vehicle condition report, via at least one communication network, to a remote device of an inspector of the vehicle.

16. The method of claim 14, further comprising:
transmitting the electronic vehicle condition report, via at least one communication network, to one or more reviewers.

17. The method of claim 16, further comprising:
upon review and approval of the electronic vehicle condition report, initiating an online vehicle auction to auction the vehicle.

18. A system comprising:
at least one computer hardware processor; and
at least one non-transitory computer-readable storage medium storing processor-executable instructions that, when executed by the at least one computer hardware processor, cause the at least one computer hardware processor to perform:
receiving magnetic field measurements of a vehicle, the magnetic field measurements collected by a magnetic field sensor positioned proximate the vehicle; and
processing the magnetic field measurements using a trained ML model to detect, from the magnetic field measurements, a characteristic of the vehicle, the processing comprising:
generating magnetic field features from the magnetic field measurements; and
processing the magnetic field features using the trained ML model to obtain an output indicative of the characteristic of the vehicle, wherein the characteristic of the vehicle is a battery type in the vehicle.

19. At least one non-transitory computer-readable storage medium storing processor-executable instructions that, when executed by at least one computer hardware processor, cause the at least one computer hardware processor to perform:

receiving magnetic field measurements of a vehicle, the magnetic field measurements collected by a magnetic field sensor positioned proximate the vehicle; and processing the magnetic field measurements using a trained ML model to detect, from the magnetic field measurements, a characteristic of the vehicle, the processing comprising:

generating magnetic field features from the magnetic field measurements; and processing the magnetic field features using the trained ML model to obtain an output indicative of the characteristic of the vehicle, wherein the characteristic of the vehicle is a battery type in the vehicle.

* * * * *